US007678408B2

(12) United States Patent
Mülders

(10) Patent No.: US 7,678,408 B2
(45) Date of Patent: Mar. 16, 2010

(54) METHOD FOR COMPENSATING FILM HEIGHT MODULATIONS IN SPIN COATING OF A RESIST FILM LAYER

(75) Inventor: Thomas Mülders, Dresden (DE)

(73) Assignee: Qimonda AG, Munich (DE)

( * ) Notice: Subject to any disclaimer, the term of this patent is extended or adjusted under 35 U.S.C. 154(b) by 1223 days.

(21) Appl. No.: 11/223,801

(22) Filed: Sep. 9, 2005

(65) Prior Publication Data

US 2007/0059946 A1 Mar. 15, 2007

(51) Int. Cl.
*B05D 3/12* (2006.01)

(52) U.S. Cl. ............................ 427/8; 427/240; 427/282; 438/780; 438/782

(58) Field of Classification Search ................... 427/8, 427/240, 282; 438/780, 782
See application file for complete search history.

(56) References Cited

U.S. PATENT DOCUMENTS

| 4,600,597 A * | 7/1986 | White et al. ................... 427/9 |
| 2003/0018443 A1* | 1/2003 | Bruce et al. ................... 702/97 |
| 2004/0058255 A1* | 3/2004 | Jessen et al. .................. 430/30 |

OTHER PUBLICATIONS

Acrivos, A., et al., "On the Flow of a Non-Newtonian Liquid on a Rotating Disk," Journal of Applied Physics, vol. 31, No. 6 (Jun. 1960) pp. 963-968.
Bornside, D.E., et al., "On the Modeling of Spin Coating," The Society for Imaging Science and Technology (1987) pp. 122-129.
Bornside, D.E., et al., "Spin Coating: One-Dimensional Model," Journal of Applied Physics, vol. 66, No. 11 (Dec. 1, 1989) pp. 5185-5193.
Chou, F.-C., et al., "Effect of Air Shear on Film Planarization During Spin Coating," Journal of the Electrochemical Society, vol. 147, No. 2 (2000) pp. 699-705.
Cochran, W.G., "The Flow Due to a Rotating Disc," Proc. Cambridge Philos. Soc., vol. 30 (1934) pp. 365-375.
Emslie, A.G., et al., "Flow of a Viscous Liquid on a Rotating Disk," Journal of Applied Physics, vol. 29, No. 5 (May 1958) pp. 858-862.
Kim, J.S., et al., "Topographic Effect of Surface Roughness on Thin-Film Flow," Journal of Applied Physics, vol. 73, No. 1 (Jan. 1, 1993) pp. 422-428.
Kim, S., et al., "On the Flow of a Thin Liquid Film Over a Rotating Disk," Journal of Applied Physics, vol. 69, No. 4 (Feb. 15, 1991) pp. 2593-2601.

(Continued)

*Primary Examiner*—Kirsten C Jolley
(74) *Attorney, Agent, or Firm*—Slater & Matsil, L.L.P.

(57) ABSTRACT

A method compensates film height modulations in spin coating of a resist film layer. From a desired layout pattern, a substrate topography as a result of lithographically structuring in image fields is determined. A spin coating model is provided to determine a modeled resist film height based on the substrate topography during spin coating of a resist film. A nominal resist film height by using the spin coating model with an unperturbed substrate topography having a flat surface is determined. Next, film height modulations based on a difference are determined for test points and the desired layout pattern is optimized by implementing further structural elements in order to form an optimized mask pattern by minimizing the film height modulations.

40 Claims, 6 Drawing Sheets

OTHER PUBLICATIONS

Ma, F., et al., "The Effect of Air Shear on the Flow of a Thin Liquid Film Over a Rough Rotating Disk," Journal of Applied Physics, vol. 68, No. 3 (Aug. 1, 1990) pp. 1265-1271.

Meyerhofer, D., "Characteristics of Resist Films Produced by Spinning," Journal of Applied Physics, vol. 49, No. 7 (Jul. 1978) pp. 3993-3997.

Middleman, S., "The Effect of Induced Air-Flow on the Spin Coating of Viscous Liquids," Journal of Applied Physics, vol. 62, No. 6 (Sep. 15, 1987) pp. 2530-2532.

Sukanek, P.C., "A Model for Spin Coating with Topography," J. Electrochem. Soc., vol. 136, No. 10 (Oct. 1989) pp. 3019-3026.

Sukanek, P.C., "Spin Coating," Journal of Imaging Technology, vol. 11, No. 4 (Aug. 1985) pp. 184-190.

Von Karman, Th., "Über Laminare Und Turbulente Reibung," Zeitschrift Für Angewandte Mathematik Und Mechanik, vol. 1, No. 4 (Aug. 1921) pp. 16 & 234-252.

Wu, P.-Y., et al., "Complete Analytical Solutions of Film Planarization During Spin Coating," Journal of the Electrochemical Society, vol. 146, No. 10 (1999) pp. 3819-3826.

* cited by examiner

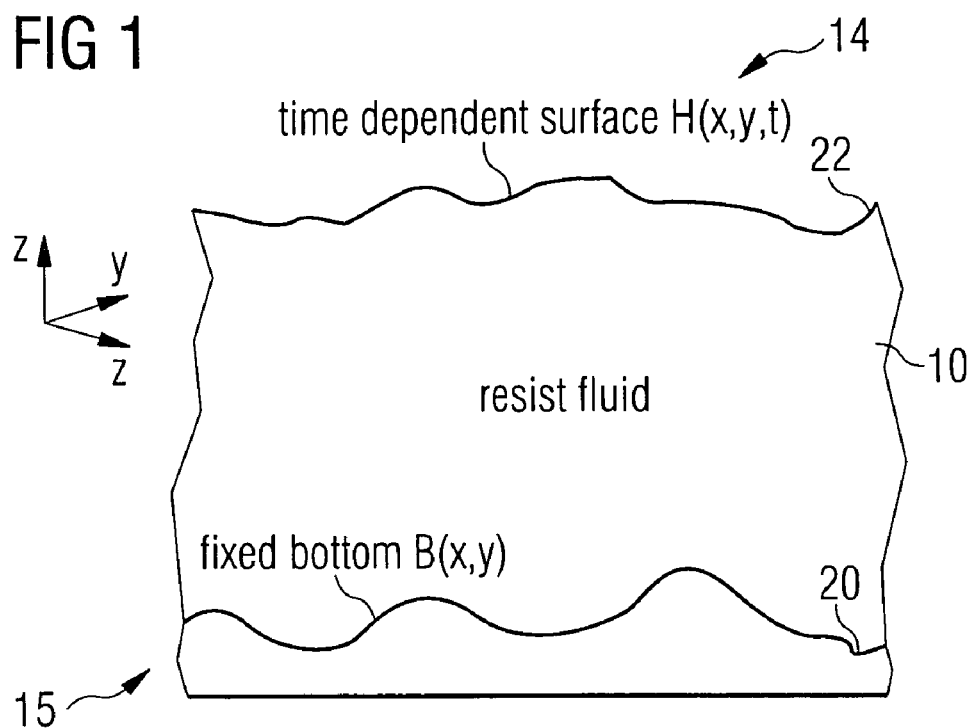
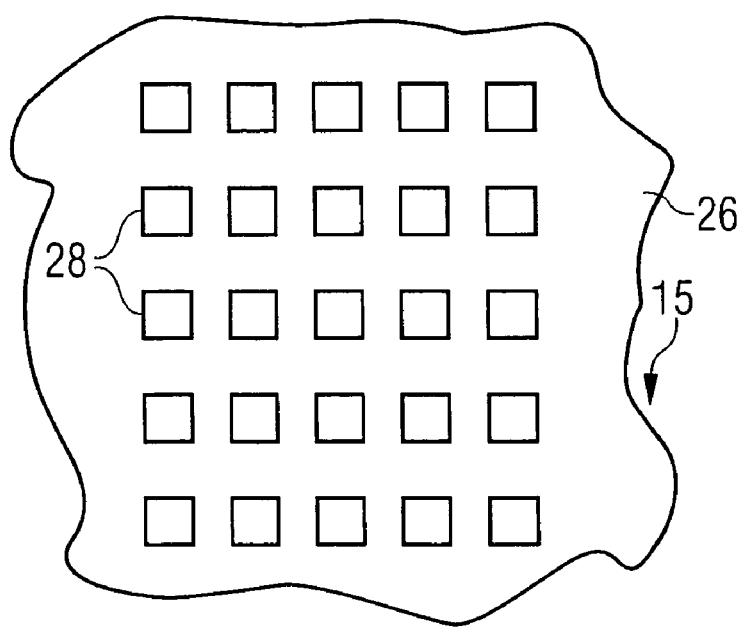

METHOD FOR COMPENSATING FILM HEIGHT MODULATIONS IN SPIN COATING OF A RESIST FILM LAYER

TECHNICAL FIELD

This invention relates to a method for compensating film height modulations in spin coating of a resist film layer.

BACKGROUND

The manufacturing of integrated circuits aims for continuously decreasing feature sizes of the fabricated components. Semiconductor manufacturing includes repeatedly projecting a pattern in a lithographic step onto a semiconductor wafer and processing the wafer to transfer the pattern into a layer deposited on the wafer surface or into the substrate of the wafer. This processing includes depositing a resist film layer on the surface of the semiconductor substrate in a spin coating process, projecting a mask with the pattern onto the resist film layer and developing or etching the resist film layer to create a resist structure.

The resist structure is transferred into a layer deposited on the wafer surface or into the substrate in an etching step. Planarization and other intermediate processes may further be necessary to prepare a projection of a successive mask level. Furthermore, the resist structure can also be used as a mask during an implantation step. The resist mask defines regions in which the electrical characteristics of the substrate are altered by implanting ions.

The spin coating process can be subdivided in four different stages. First, resist material is deposited on the wafer. Many different ways of deposition exist, for a description see D. E. Bornside, C. W. Macosko, and L. E. Scriven, "On the Modeling of Spin Coating", J. Imaging Technology, 13, pages 122-130, 1987. In a second stage, the spin-up step, the wafer rotates and the entire wafer surface is covered with resist liquid. In the third stage, the spin-off step, excess liquid is removed from the wafer. The liquid flows radially outward and flies off the edge of the rotating disk. During this stage steep wave fronts of the resist liquid can form but they run radially outward. Behind these fronts a film of nearly uniform thickness is established if the wafer surface is flat.

It is a characteristic feature of the spin coating process that when the resist film continues thinning the film surface has the tendency to become more and more uniform. The fourth stage consists of solidifying the resist material. Solvent has evaporated during the preceding stages and, therefore, the resist has meanwhile become so viscous that the loss rate of resist material due to the radial outflow has already reduced much. Thereafter, the mass loss due to ongoing solvent evaporation dominates the further thinning of the resist material.

Finally, if the spin coating time has exceeded a certain limit solvent evaporation also ceases. Further prolongation of the spinning time has no significant influence anymore. The film height approaches a steady state.

Thickness variations of photo resist films are highly undesirable during chip manufacturing. The reason being that the sizes of the structures that are lithographically to be imaged depend sensitively on the resist thickness. Varying resist thicknesses over the wafer can directly impact the chip yield. Usually, if the wafer substrate is flat, spin coating yields very uniform resist film surfaces. However, sometimes the wafer substrate is not flat but shows a distinctive topography. For instance, the necessity to coat a resist film directly on a given layer structure can arise due to economical reasons because it is time-consuming and expensive to planarize (to some extent) a wafer surface with an intermediate coating layer.

Experimentally, for spin coating over topographies, it can often be observed that although the wafer topographies are periodically repeated inside the chip areas on the wafer, the resist film's thickness variations after spin coating are not. The observed thickness varies not only as a function of the topography inside a single chip area, but also depends strongly on the wafer position of the chip. If the resist film height varies from chip to chip it becomes impossible to lithographically form the same structures inside the different chip areas on the wafer. The operating parameters during spin coating e.g. spin speed and initial viscosity have to be chosen such that this undesired wafer signature is minimized.

Besides the experimental observations as described above, many theoretical studies exist that try to model the spin coating process.

Historically, theoretical spin coating studies were initiated by the work of A. G. Emslie, F. T. Bonner, and L. G. Peck, "Flow of Viscous Liquid on a Rotating Disk", J. Appl. Phys., Vol. 29, 5, pages 858-862, 1958 (hereinafter, "Emslie, et al."). In this document, the flow behavior of the resist on a rotating disk is analyzed and the time-dependent film height is related to the resist flow beneath the surface. The velocity field inside the resist film has been derived in the framework of the lubrication approximation of the Navier-Stokes equations and the resist has been treated as an incompressible Newtonian liquid.

Emslie, et al. theoretically explained the experimental fact that a flat film surface results when a resist is spun on a flat rotating substrate and that initially non-uniform film profiles tend to become more and more uniform under centrifugation. Later on, the work of Emslie, et al. has been extended in many respects.

As one of the extensions, the document of S. Middleman, "The effect of induced air-flow on the spin coating of viscous liquids", J. Appl. Phys., Vol. 62, 6, pages 2530-2532, 1987, (hereinafter, "Middleman") should be mentioned. Importantly, Middleman incorporated the effect of shear stress at the resist-air interface on the rate of thinning of the film. The shearing stress at the resist-air interface results because the rotating disk, e.g., a semiconductor wafer, acts like a "centrifugal pump" or fan.

Due to the disk rotation and the friction between the air and the disk surface, the air above the disk gets a velocity component tangential to the disk circumference. This tangential velocity induces also a radial velocity component due to the centrifugal acceleration. The radial outflow of the air in turn results in a vertical air flow towards the disk. Of special interest is the fact that significant radially and tangentially directed shearing forces are generated by the air flow.

Middleman employed an existing analytical solution of the velocity field of the air given by W. G. Cochran, "The flow due to a rotating disk", Proc. Cambridge Philos. Soc., 30, pages 365-375, 1934 (hereinafter, "Cochran"), and used this analytical expression for the radially directed shear stress to show that the shear stress has a significant influence on the rate of film thinning. The radially directed shear stress is given by $$\tau_{rz}^{air} = \frac{1}{2}\omega^{3/2}\mu_{air}^{1/2}\rho_{air}^{1/2}r \tag{1}$$

where r is the radial coordinate on the disk, the component $\tau_{rz}^{air}$ stands for the r-component of the force per unit area across a plane surface element normal to the z-direction, $\omega$ is the angular velocity of the rotating disk, and $\mu_{air}$ and $\rho_{air}$ denote the dynamic viscosity and density of air, respectively.

The expression by Cochran for the tangentially acting stress reads $$\tau_{\Theta z}^{air} = -0{,}616\omega^{3/2}\mu_{air}^{1/2}\rho_{air}^{1/2} r \qquad (2)$$

where $\Theta$ is the azimuthal coordinate on the disk and the stress component $\tau_{\Theta z}^{air}$ stands for the $\Theta$-component of the force per unit area across a plane surface element normal to the z-direction.

The formulas (1) and (2) for the radial and tangential air shear above the wafer are accurate as long as a Reynolds-number criterion is met, in the form $$R^2 \omega \rho_{air}/\mu_{air} < 3 \times 10^5 \qquad (3)$$

For a 300 mm wafer (radius r=15 cm), a spin speed $\omega$=1300 rpm and the kinematic viscosity of air at normal conditions, the Reynolds number is $2.04 \times 10^5$, which is not too much under the above limit.

At higher spin speeds ($\omega$>1900 rpm) turbulent air flow above the wafer sets in, which would degrade the spin coating performance. It should be noted, that the radial and tangential components $\tau_{rz}^{air}$ and $\tau_{\Theta z}^{air}$ can as well be expressed in the lateral Cartesian coordinate basis that is co-rotating with the wafer, $$\tau_{xz}^{air} = R \cdot x - T \cdot y \qquad (4)$$

and $$\tau_{yz}^{air} = R \cdot y + T \cdot x,$$

where $$R = \frac{1}{2}\omega^{3/2}\mu_{air}^{1/2}\rho_{air}^{1/2}$$

and $$T = -0{,}616\omega^{3/2}\mu_{air}^{1/2}\rho_{air}^{1/2}$$

In the document of D. Meyerhofer, "Characteristics of resist films produced by spinning", J. Appl. Phys., Vol. 49, 7, pages 3993-3997, 1978 (hereinafter, "Meyerhofer"), a spin coating model is presented including an evaporation rate of solvent during resist spinning. Meyerhofer proposed a solvent evaporation rate that is proportional to the square root of the angular velocity. Using this functional dependence of the evaporation rate on the spinning speed, Meyerhofer calculated model predicted time-dependent film heights for various spin speeds and compared to measured values.

In the documents of P. C. Sukanek, "Spin Coating", J. Imaging Technology, Vol. 11, 4, pages 184-190, 1985 and P. C. Sukanek, "A model for Spin Coating with Topography", J. Electrochem. Soc., Vol. 136, 10, pages 3019-3026, 1989 (collectively hereinafter, "Sukanek"), Meyerhofer's evaporation approach is further extended by accounting also for the dependence of the evaporation rate on solvent content and gas-phase resistance. Sukanek modeled the evaporation rate e with units mass/(time×area) as $$e = \alpha\omega^{1/2}(\rho_s - \rho_s^{res}), \qquad (5)$$

where $\alpha$ is a constant and $\rho_s$ denotes the mass density of the solvent. The parameter $\rho_s^{res}$ stands for the density of residual solvent that is known to remain in the film after spin coating.

The residual solvent density in (5) is to be considered as an empirical quantity accounting approximately for the gas-phase resistance due to saturation above the film and the finally reduced solvent mobility inside the film.

Sukanek also included surface tension forces and surface tension gradients in his treatment. In Sukanek's treatment of spin coating over topographies both the pressure as well as the solvent content become functions of the lateral coordinates in the wafer plane. The surface tension coefficient and the viscosity depend on the local solvent content and are also spatially dependent. Sukanek's approach allowed taking into account the spatial variations of viscosity and surface tension coefficient.

Other approaches for spin coating over topographical wafer surfaces have been disclosed by P. -Y. Wu and F. -C. Chou, "Complete analytical solutions of film planarization during spincoating", J. Electrochem. Soc., Vol. 146, 10, pages 3819-3826, 1999, F. -C. Chou and P. -Y. Wu, "Effect of air shear on film planarization during spin coating", J. Electrochem. Soc., Vol. 147, 2, pages 699-705, 2000, S. Kim, J. S. Kim, and F. Ma, "On the flow of a thin liquid film over a rotating disk", J. Appl. Phys., Vol. 69, 4, pages 2593-2601, 1981, and J. S. Kim, S. Kim, and F. Ma, "Topographic effect of surface roughness on thin-film flow", J. Appl. Phys., Vol. 73, 1, pages 422-428, 1993.

A conceptional advantage compared to other approaches is Sukanek's treatment of solvent evaporation and of local surface tension and viscosity gradients, which are a consequence of topographically induced perturbations of the solvent flow during spin coating. During the time evolution these effects are coupled to the film height evolution.

The above-described methods are, however, to some extent approximations that rely on certain assumptions. Further investigations might be necessary to provide more detailed results for studying resist film variations of a topography on a wafer.

SUMMARY OF THE INVENTION

In one aspect, the invention provides a method for compensating film height modulations in spin coating of a resist film layer. It is a further aspect of the invention to provide methods for compensating film height modulations in spin coating of a resist film layer being capable of determining resist film modulations.

A first embodiment of the present invention provides for a method for compensating film height modulations in spin coating of a resist film layer. A desired layout pattern includes a plurality of structural features, each having characteristic feature sizes. A substrate topography is determined as a result of lithographically structuring a substrate with the desired layout pattern in a plurality of image fields. A spin coating model is applicable to determine a modeled resist film height based on the substrate topography during spin coating of a resist film. A nominal resist film height is determined by using the spin coating model with an unperturbed substrate topography having a flat surface. A plurality of test points on the substrate are selected. Film height modulations are determined based on a difference of the nominal resist film height and the modeled resist film height for each of the test points. The desired layout pattern is optimized by implementing further structural elements in order to form an optimized mask pattern by minimizing the film height modulations.

Yet another embodiment is provided by a method for compensating film height modulations in spin coating of a resist film layer, including providing a desired layout pattern comprising a plurality of structural features each having characteristic feature sizes. A substrate topography is determined as a result of lithographically structuring a substrate with the desired layout pattern in plurality of image fields. A spin coating model is applicable to determine a modeled resist film height based on the substrate topography during a spin coating step of a resist film on the substrate as a function of respective positions on the substrate. A modeled resist film height is determined for each of the respective positions on the substrate, as well as an average resist film height based on the nominal resist film heights. Film height modulations are determined based on a difference of the average resist film height and the modeled resist film height for each of the respective positions, and the desired layout pattern is optimized by implementing further structural elements in order to form an optimized mask pattern by minimizing the film height modulations.

Another embodiment is provided by a method for compensating film height modulations in spin coating of a resist film layer. A desired layout pattern is provided including a plurality of structural features each having characteristic feature sizes. A substrate topography is determined as a result of lithographically structuring a substrate with the desired layout pattern in a plurality of image fields, the image fields having an active area and a surrounding kerf area. A spin coating model is applicable to determine a modeled resist film height based on the substrate topography during spin coating of a resist film. A nominal resist film height is determined by using the spin coating model with an unperturbed substrate topography having a flat surface. A plurality of test points on the substrate are selected, and film height modulations are determined based on a difference of the nominal resist film height and the modeled resist film height for each of the test points. The desired layout pattern is optimized by implementing further structural elements in order to form an optimized mask pattern by minimizing the film height modulations.

Yet another embodiment is provided by a computer program product for compensating film height modulations in spin coating of a resist film layer including computer readable instructions so as to cause a computer to store a desired layout pattern including a plurality of structural features each having characteristic feature sizes. A substrate topography is determined as a result of lithographically structuring a substrate with the desired layout pattern in plurality of image fields. A spin coating model is stored, the spin coating model being applicable to determine a modeled resist film height based on the substrate topography during a spin coating step of a resist film on the substrate as a function of respective positions on the substrate. A modeled resist film height is determined for each of the respective positions on the substrate. An average resist film height is determined based on the nominal resist film heights, and film height modulations are determined based on a difference of the average resist film height and the modeled resist film height for each of the respective positions. The desired layout pattern is optimized by implementing further structural elements in order to form an optimized mask pattern by minimizing the film height modulations.

Another embodiment is provided by a storage medium being readable for a computer and having stored computer readable instructions to perform a program on the computer for optimizing a photolithographic mask. A desired layout pattern is stored including a plurality of structural features each having characteristic feature sizes. A substrate topography is determined as a result of lithographically structuring a substrate with the desired layout pattern in plurality of image fields. A spin coating model being applicable to determine a modeled resist film height based on the substrate topography during a spin coating step of a resist film, is stored on the substrate as a function of respective positions on the substrate. A modeled resist film height is determined for each of the respective positions on the substrate. An average resist film height is determined based on the nominal resist film heights. Film height modulations are determined based on a difference of the average resist film height and the modeled resist film height for each of the respective positions, and the desired layout pattern is optimized by implementing further structural elements in order to form an optimized mask pattern by minimizing the film height modulations.

Yet another embodiment is provided by a system for structuring a surface of a substrate including a means for providing a desired layout pattern including a plurality of structural features each having characteristic feature sizes. A means for determining a substrate topography is provided as a result of lithographically structuring a substrate with the desired layout pattern in plurality of image fields. A means for providing a spin coating model, which is applicable to determine a modeled resist film height based on the substrate topography during spin coating of a resist film is also provided. A means for determining a nominal resist film height by using the spin coating model with an unperturbed substrate topography having a flat surface is provided. A means for selecting a plurality of test points on the substrate, a means for determining film height modulations based on a difference of the nominal resist film height and the modeled resist film height for each of the test points, and a means for optimizing the desired layout pattern by implementing further structural elements in order to form an optimized mask pattern by minimizing the film height modulations are also provided. A lithographic mask in accordance with the optimized mask pattern, a means for structuring the substrate using the lithographic mask, and a spin coating device for coating a resist film onto the substrate are also provided.

BRIEF DESCRIPTION OF THE DRAWINGS

The above features of the present invention will be more clearly understood from consideration of the following descriptions in connection with accompanying drawings in which:

FIG. 1 depicts a cross sectional view of a resist film on a substrate surface;

FIG. 4 illustrates topography on a substrate according to an embodiment of the invention;

DETAILED DESCRIPTION OF ILLUSTRATIVE EMBODIMENTS

Figure 2:
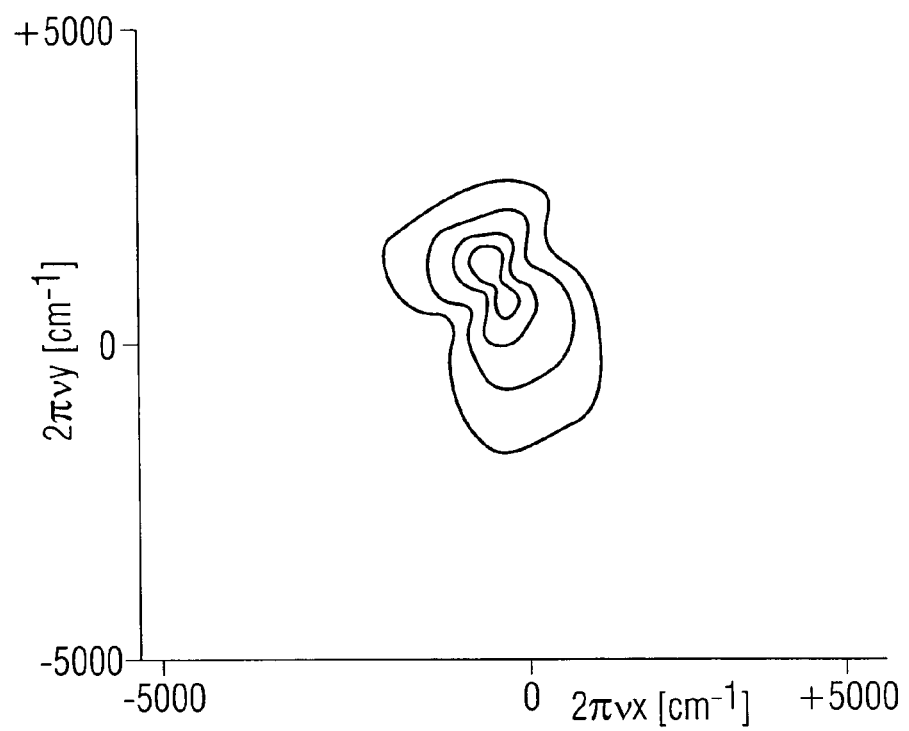
FIG. 2 illustrates a result of the spin coating model according to an embodiment of the invention.

A presently preferred embodiment of the methods and the system according to the invention is discussed in detail below. It is appreciated, however, that the present invention provides many applicable inventive concepts that can be embodied in a wide variety of specific contexts. The specific embodiments discussed are merely illustrative of specific ways to apply the method and the system of the invention, and do not limit the scope of the invention.

In the following, embodiments are described with respect to lithographically structuring a semiconductor wafer by using a resist film layer. The invention, however, might also be useful for fabrication of other components that require structuring a surface, like LCD-panels or the like.

The present first embodiment of the invention focuses mainly on the modeling of wafer signatures for the finally approached steady state. In the steady state the equations describing solvent and film height modulations are shown to decouple. The steady state does not depend on viscosity and surface tension gradients and also solvent evaporation has stopped in the steady state. Nevertheless, the presented equations can also be used for modeling the time evolution of wafer signatures. For the time evolution, the coupling between film height and solvent fraction inhomogeneities is important.

Furthermore, shearing stress due to the air flow above the wafer will be taken into account. The impact of shearing stress on the wafer signature of the film height modulations is analyzed.

In the following, the basic equations that govern the time and space evolution of the film height and the solvent content are derived. First, the governing equation for the film height will be derived. The second part deals with the derivation of an evolution equation for the solvent mass fraction.

The two main results of the first and second part of this section are partial differential equations for the evolution of the film height and the local solvent mass fraction. Both equations are expressed in a Cartesian coordinate frame that is co-rotating with the wafer. The equations for the film height and the solvent fraction are formulated in terms of the velocity field beneath the resist film surface.

In the last part the velocity field of the resist on the rotating wafer is derived on the basis of the Navier-Stokes equations for an incompressible Newtonian resist liquid. The derived velocity field makes it possible to give concrete formulas for the evolution of the film height and the solvent content whose solution is tackled in the following sections.

Employing the appropriate boundary conditions for the velocity field at the resist film's surface the influences of solvent evaporation, resist film curvature and surface tension gradients on the film height and the local solvent content will be incorporated.

With respect to FIG. 1, the geometrical situation that applies throughout the description is depicted. FIG. 1 shows a portion of the resist film 10 with rigid bottom 20 and time dependent surface 22. The rigid bottom 20 of the topology on a substrate 15 is described by the function $B(x,y)$, while the time-dependent surface 22 of the resist film 10 is described by $H(x,y,t)$, with x and y being Cartesian coordinates.

In the following, a general relation between the surface 22 of the resist film 10 and the velocity field inside the resist film 10 is derived. This relation is the necessary link for constructing the resist surface 22 as soon as a solution of the Navier-Stokes equations for the velocity field has been obtained.

For an incompressible fluid the continuity equation (mass conservation) reduces to $\nabla \cdot v = 0$, where $v = (u,v,w)^T$ is the vector of the Cartesian velocity components. Integrating the continuity equation from the bottom 20 to the top 22 of the resist yields $$0 = \int_{B(x,y)}^{H(x,y,t)} \left( \frac{\partial u}{\partial x} + \frac{\partial v}{\partial y} + \frac{\partial w}{\partial z} \right) dz = \qquad (6)$$

$$w(H) - w(B) + \int_{B(x,y)}^{H(x,y,t)} \left( \frac{\partial u}{\partial x} + \frac{\partial v}{\partial y} \right) dz.$$

While mass conservation holds inside the resist film 10, evaporation comes into play at the resist-air interface.

At the resist film's top boundaries denoted H and bottom boundaries denoted B the velocities (u,v,w) fulfill $$w(B) = u(B)\frac{\partial B}{\partial x} + v(B)\frac{\partial B}{\partial v} \qquad (7)$$

and $$\frac{dH}{dt} = \frac{\partial H}{\partial t} + u(H)\frac{\partial H}{\partial x} + v(H)\frac{\partial H}{\partial y} = w(H) - \frac{e}{\rho}. \qquad (8)$$

Equation (7) is a consequence of the most general boundary condition at a rigid surface, where the velocity field at the bottom must be perpendicular to the normal of the rigid surface 20 of the bottom. This condition for the velocity field is the so-called "no penetration" boundary condition, which suffices to derive the evolution equation for the film height $H(x,y,t)$. Below, the "no slip" boundary condition will be employed. The resulting "no slip, no penetration" boundary condition then states $u=v=w=0$ at $z=B$.

In equation (8), $\rho$ denotes the density of the resist fluid 10. For the case of an evaporating liquid, where e represents the evaporation rate with units mass/(time×area), equation (8) expresses the kinematic boundary condition for the velocities at the free surface. On account of the Leibniz's rule, $$\frac{\partial}{\partial x}\int_{B(x,y)}^{A(x,y)} F(x, y, z) dz = \int_{B(x,y)}^{A(x,y)} \frac{\partial F}{\partial x} dz + F(A)\frac{\partial A}{\partial x} - F(B)\frac{\partial B}{\partial x} \qquad (9)$$

the integrals appearing in equation (6) can be reformulated. This yields for the depth-integrated continuity equation (6)

$$0 = w(H) - w(B) + \frac{\partial}{\partial x}\int_{B(x,y)}^{H(x,y,t)} u\, dz - u(H)\frac{\partial H}{\partial x} + \qquad (10)$$

$$u(B)\frac{\partial B}{\partial x} + \frac{\partial}{\partial y}\int_{B(x,y)}^{H(x,y,t)} v\, dz - v(H)\frac{\partial H}{\partial y} + v(B)\frac{\partial B}{\partial y}$$

Inserting the boundary conditions (7) and (8), this becomes a partial differential equation relating the surface 22 height $H(x,y,t)$, the velocity flow rates $Q_x$ and $Q_y$ and the evaporation rate e $$\frac{\partial H}{\partial t} = -\frac{\partial}{\partial x}Q_x - \frac{\partial}{\partial y}Q_y - \frac{e}{\rho} \qquad (11)$$

with $$Q_x = \int_B^H u\, dz$$

and $$Q_y = \int_B^H v\, dz.$$

The balance equation for the mass density of the solvent in the resist film 10 reads $$\frac{\partial \rho_s}{\partial t} + \nabla \cdot j = 0 \tag{12}$$

where j is the solvent flux due to convection and diffusion $$j = \underbrace{-D\Delta\rho_s}_{\text{diffusive flux}} + \underbrace{v\rho_s}_{\text{convective flux}} \tag{13}$$

Here D is the diffusion coefficient and v denotes the velocity vector $v=(u,v,w)^T$. The resist film has generally much smaller extension along the z-direction than along the lateral coordinate axes x and y, as the substrate surface 20 is much larger compared to the thickness of the resist film 10. Consequently, derivatives in x- and y-direction in the diffusion term are negligible compared to the corresponding ones containing the derivatives with respect to the z-direction.

As a result, it allows the balance equation for the mass density of the solvent to be approximated as $$\frac{\partial \rho_s}{\partial t} + \frac{\partial (u\rho_s)}{\partial x} + \frac{\partial (v\rho_s)}{\partial y} + \frac{\partial (w\rho_s)}{\partial z} = \frac{\partial}{\partial z}\left(D\frac{\partial \rho_s}{\partial z}\right). \tag{14}$$

Integrating equation (14) over the resist thickness and using Leibniz's rule (9) yields to:

$$\frac{\partial}{\partial t}\int_B^H \rho_s dz - \rho_s(H)\frac{\partial H}{\partial t} + \frac{\partial}{\partial x}\int_B^H \rho_s u dz - \rho_s(H)u(H)\frac{\partial H}{\partial x} + \tag{15}$$

$$\rho_s(B)u(B)\frac{\partial B}{\partial x} + \frac{\partial}{\partial y}\int_B^H \rho_s v dz - \rho_s(H)v(H)\frac{\partial H}{\partial y} +$$

$$\rho_s(B)v(B)\frac{\partial B}{\partial y} + \rho_s(H)w(H) - \rho_s(B)w(B) = D\left(\frac{\partial \rho_s}{\partial z}\bigg|_{z=H} - \frac{\partial \rho_s}{\partial z}\bigg|_{z=B}\right)$$

Introducing the solvent mass fraction $x_s=\rho_s/\rho$, the assumption of a constant density $\rho$ and using the fact that the velocity vector at the bottom z=B has no component normal to the substrate 15, this equation can be rewritten as $$\frac{\partial}{\partial t}(\langle x_s\rangle(H-B)) + \frac{\partial}{\partial x}\int_B^H x_s u dz + \frac{\partial}{\partial y}\int_B^H x_s v dz - \tag{16}$$

$$x_s(H)\underbrace{\left(\frac{\partial H}{\partial t} + u(H)\frac{\partial H}{\partial x} + v(H)\frac{\partial H}{\partial y} - w(H)\right)}_{=dH/dt} = D\left(\frac{\partial x_s}{\partial z}\bigg|_{z=H} - \frac{\partial x_s}{\partial z}\bigg|_{z=B}\right)$$

where $\langle x_s\rangle$ denotes the z-averaged mass fraction of the solvent.

Next, the boundary conditions must be considered. At the resist film's bottom z=B, the solvent mass flux vanishes. Since w(B)=0 (no slip, no penetration) this condition reduces to $$\rho D \frac{\partial x_s}{\partial z}\bigg|_{z=H} = 0.$$

At the resist film's top z=H, two boundary conditions are to be considered. The first is the kinematic boundary condition that has already been introduced in equation (8):

$$\frac{dH}{dt} = w - \frac{e}{\rho}.$$

The surface height H varies due to the vertical velocity component but can also recede due to evaporation of solvent. The second boundary condition concerns the solvent flux at the film surface 22

$$\rho\left(D\frac{\partial x_s}{\partial z} - \left(w - \frac{dH}{dt}\right)x_s\right) = -e \quad \text{at} \quad z = H \tag{17}$$

stating that the evaporation flux is given by the diffusive and convective parts of the outward solvent flux expressed in a reference frame moving with the surface. Combining this solvent flux boundary condition with the kinematic boundary condition (8) gives $$D\frac{\partial x_s}{\partial z} = -\frac{e}{\rho}(1 - x_s(H)). \tag{18}$$

Inserting the above in (16) yields $$\frac{\partial}{\partial t}(\langle x_s\rangle(H-B)) + \frac{\partial}{\partial x}\int_B^H x_s u dz + \frac{\partial}{\partial y}\int_B^H x_s v dz = -\frac{e}{\rho}. \tag{19}$$

Similar to P. C. Sukanek, Spin Coating, J. Imaging Technology, 11, 4, pages 184-190, 1985, this equation can be approximated by replacing the mass fraction $x_s$ appearing in the integrals with the z-averaged mass fraction $\langle x_s\rangle$:

$$\int_B^H x_s u dz \approx \langle x_s\rangle Q_x$$

and $$\int_B^H x_s u dz \approx \langle x_s\rangle Q_x,$$

with $$Q_x = \int_B^H u\, dz$$

and $$Q_y = \int_B^H v\, dz.$$

With these approximations and on account of the relation for resist film height, see equation (11), equation (19) can be expressed as $$\frac{\partial \langle x_s \rangle}{\partial t} = -\frac{1}{H-B}\left\{Q_x \frac{\partial \langle x_s \rangle}{\partial x} + Q_y \frac{\partial \langle x_s \rangle}{\partial y} + \frac{e}{\rho}(1 - \langle x_s \rangle)\right\} \quad (20)$$

Having established the governing equations for the resist film height H and the z-averaged solvent fraction $\langle x_s \rangle$, the flow rates $$Q_x = \int_B^H u\,dz \text{ and } Q_y = \int_B^H v\,dz \quad (21)$$

have to be specified that enter the equations (11) and (20).

The velocity field u and v necessary for calculating $Q_x$ and $Q_y$ can be obtained in the framework of the Navier-Stokes equations for an incompressible Newtonian fluid. Together with the continuity equation the Navier-Stokes equations form four equations for the four unknowns given by the three velocity components u, v, w and the pressure p.

In the rotating coordinate system on the wafer, three force contributions enter the Navier-Stokes equations: the Coriolis forces, centrifugal forces and gravitational forces. For the spin coating problem Coriolis and gravitational forces, however, are orders of magnitude smaller than the centrifugal forces and the force vector can be approximated by the centrifugal forces.

For the spin coating problem the resist film thickness is much smaller than the lateral film extension. Under these circumstances the so-called "thin film" or "lubrication" approximation of the Navier-Stokes equations holds. Then the Navier-Stokes equations for the velocities u, v, w inside a thin film on a rotating wafer and the continuity equation simplify to:

$$-\rho\omega^2 x = \mu \frac{\partial^2 u}{\partial z^2} - \frac{\partial p}{\partial x} \quad (22)$$

$$-\rho\omega^2 y = \mu \frac{\partial^2 v}{\partial z^2} - \frac{\partial p}{\partial y}$$

$$0 = \frac{\partial p}{\partial z}$$

$$0 = \frac{\partial u}{\partial x} + \frac{\partial v}{\partial y} + \frac{\partial w}{\partial z}.$$

The first two equations can be interpreted as a force balance between the outward directed centrifugal forces on a fluid element and the viscous and pressure forces acting on the surface 22 of a fluid element. The third equation shows that the pressure does not depend on the vertical z-coordinate.

Additionally, the viscosity $\mu$ is modeled to depend on the z-averaged solvent fraction $\langle x_s \rangle$ only. Provided the appropriate boundary conditions are known at the substrate z=B(x,y) and at the resist surface z=H(x,y,t), the z-independence of the pressure and the viscosity allows the velocity field easily to be constructed by integrating the first two equations in (22) twice over the resist depth.

At the substrate 20 the boundary conditions for the velocity field read (no slip, no penetration)

$$u=0=v \text{ for } z=B(x,y) \quad (23)$$

expressing that the resist fluid moves with the substrate.

At the resist surface the necessary boundary condition can be expressed in terms of the components of the stress tensor normal and tangential to the surface, respectively. While the normal stress tensor components specify the pressure, the tangential stresses refer to the viscous shearing forces.

For a Newtonian liquid, the viscous shearing stresses can be calculated. In the approximation given by the lubrication theory, the tangential stress components for the Newtonian resist fluid reduce to:

$$\tau_{xz} = \mu \frac{\partial u}{\partial z} \text{ and } \tau_{yz} = \mu \frac{\partial v}{\partial z}. \quad (24)$$

Above the resist surface the tangential stress tensor components in air are given by equation (4). The differences across the resist surface 22 between the tangential stress tensor components in resist 10 and in air 14 must be balanced by the tangential component of the surface tension gradient $\nabla \gamma$.

The model assumption of a surface tension coefficient $\gamma$ that depends only on the z-averaged solvent fraction $\gamma = \gamma(\langle x_s \rangle)$, leads to the following boundary condition for the tangential stresses at the resist-air interface:

$$\mu \frac{\partial u}{\partial z} - Rx + Ty = \frac{\partial \gamma}{\partial x} \text{ and } \mu \frac{\partial v}{\partial z} - Ry - Tx = \frac{\partial \gamma}{\partial y} \quad (25)$$

for z=H, where the constants R and T specifying the stress tensor in air at the resist surface 22 are defined in (4).

Using the above boundary conditions in equation (23) and (25) together with the first two equations of motion in (22), the following description for the velocity field can be derived:

$$u(x,y,z) = \frac{1}{\mu}\left\{\begin{array}{l}(z-B)\left(Rx - Ty + \frac{\partial \gamma}{\partial x} + \right.\\ (H-B)\left(\omega^2 \rho x - \frac{\partial p}{\partial x}\right)\right) - \\ \frac{(z-B)^2}{2}\left(\omega^2 \rho x - \frac{\partial p}{\partial x}\right)\end{array}\right\}, \quad (26)$$

$$v(x,y,z) = \frac{1}{\mu}\left\{\begin{array}{l}(z-B)\left(Ry + Tx + \frac{\partial \gamma}{\partial y} + \right.\\ (H-B)\left(\omega^2 \rho y - \frac{\partial p}{\partial y}\right)\right) - \\ \frac{(z-B)^2}{2}\left(\omega^2 \rho y - \frac{\partial p}{\partial y}\right)\end{array}\right\}$$

Equations (26) can be integrated over z giving for the velocity fluxes $$Q_x = \frac{1}{\mu}\left\{\left(Rx - Ty + \frac{\partial \gamma}{\partial x}\right)\frac{(H-B)^2}{2} + \left(\omega^2 \rho x - \frac{\partial p}{\partial x}\right)\frac{(H-B)^3}{3}\right\}, \quad (27)$$

$$Q_y = \frac{1}{\mu}\left\{\left(Ry - Tx + \frac{\partial \gamma}{\partial y}\right)\frac{(H-B)^2}{2} + \left(\omega^2 \rho y - \frac{\partial p}{\partial y}\right)\frac{(H-B)^3}{3}\right\}.$$

Inserting these equations into (11) and (20) and using for the evaporation rate e the expression of equation (5), this yields the governing equations for the film height:

$$\frac{\partial H}{\partial t} = \frac{1}{\mu^2}\left\{\frac{(H-B)^2}{2}\right. \tag{28}$$

$$\left(R\left[x\frac{\partial \mu}{\partial x} + y\frac{\partial \mu}{\partial y}\right] - T\left[y\frac{\partial \mu}{\partial x} - x\frac{\partial \mu}{\partial y}\right] + \frac{\partial \mu}{\partial x}\frac{\partial \gamma}{\partial y} + \frac{\partial \mu}{\partial y}\frac{\partial \gamma}{\partial y}\right) +$$

$$\frac{(H-B)^3}{3}\left(\omega^2\rho\left(x\frac{\partial \mu}{\partial x} + \frac{\partial \mu}{\partial y}\right) - \frac{\partial \mu}{\partial x}\frac{\partial p}{\partial x} - \frac{\partial \mu}{\partial y}\frac{\partial p}{\partial y}\right)\right\} -$$

$$\frac{1}{\mu}\left\{(H-B)\frac{\partial(H-B)}{\partial x}\left(Rx - Ty + \frac{\partial \gamma}{\partial x}\right) +\right.$$

$$(H-B)^2\frac{\partial(H-B)}{\partial x}\left(\omega^2\rho x - \frac{\partial p}{\partial x}\right) +$$

$$(H-B)\frac{\partial(H-B)}{\partial y}\left(Ry + Tx + \frac{\partial \gamma}{\partial y}\right) + (H-B)^2\frac{\partial(H-B)}{\partial y}$$

$$\left(\omega^2\rho y - \frac{\partial p}{\partial y}\right) + \frac{(H-B)^2}{2}\left(2R + \frac{\partial^2 \gamma}{\partial x^2} + \frac{\partial^2 \gamma}{\partial y^2}\right) +$$

$$\left.\frac{(H-B)^3}{3}\left(2\omega^2\rho - \frac{\partial^2 p}{\partial x^2} - \frac{\partial^2 p}{\partial y^2}\right)\right\} - a\omega^{1/2}(\langle x_s\rangle - x_s^{res})$$

and the z-averaged solvent fraction:

$$\frac{\partial \langle x_s\rangle}{\partial t} = -\frac{1}{\mu} \tag{29}$$

$$\left\{\frac{\partial \langle x_s\rangle}{\partial x}\left[\frac{H-B}{2}\left(Rx - Ty + \frac{\partial \gamma}{\partial x}\right) + \frac{(H-B)^2}{3}\left(\omega^2\rho x - \frac{\partial p}{\partial x}\right)\right] +\right.$$

$$\left.\frac{\partial \langle x_s\rangle}{\partial y}\left[\frac{H-B}{2}\left(Ry + Tx + \frac{\partial \gamma}{\partial y}\right) + \frac{(H-B)^2}{3}\left(\omega^2\rho y - \frac{\partial p}{\partial y}\right)\right]\right\} -$$

$$\frac{a\omega^{1/2}}{H-B}(1 - \langle x_s\rangle)(\langle x_s\rangle - x_s^{res})$$

It should be noted that these equations are still to be completed by an expression for the pressure, which can be obtained by considering the boundary condition for the normal stress tensor components. It is convenient, however, to leave that expression for the moment undetermined. The necessary expression for the pressure will be discussed below where an approximate solution of the equations (28) and (29) is described using the methods of perturbation theory.

It should also be noted that the equations (28) and (29) explicitly contain only surface tension gradients ("Marangoni forces"). It is the relation for the pressure to be derived below that will incorporate also the "curvature forces" due to surface tension in the model equations.

Additionally, a solution of equations (28) and (29) requires also constitutive equations to be known for the dependence of the surface tension coefficient $\gamma$ and the viscosity $\mu$ on the z-averaged solvent fractions $\langle x_s\rangle$. On account of such relations $\gamma=\gamma(\langle x_s\rangle)$ and $\mu=\mu(\langle x_s\rangle)$ the derivatives with respect to x and y are to be expressed as $$\frac{\partial \gamma}{\partial q} = \frac{\partial \gamma}{\partial \langle x_s\rangle}\frac{\partial \langle x_s\rangle}{\partial q} \text{ and } \frac{\partial \mu}{\partial q} = \frac{\partial \mu}{\partial \langle x_s\rangle}\frac{\partial \langle x_s\rangle}{\partial q},$$

where q=x, y. (30)

Thus, provided an expression for the pressure is available and the appropriate initial and boundary conditions are given, knowledge of the dependence of the surface tension coefficient $\gamma$ and the viscosity $\mu$ on the solvent fraction $\langle x_s\rangle$ closes the set of equations (28) and (29).

Next, a calculation of perturbations will be performed. The substrate topography B(x,y) is to be considered as the perturbing quantity due to which the resist film height H and the z-averaged solvent fraction $\langle x_s\rangle$ deviate from uniformity.

The first order perturbational treatment linearizes the equations (28) and (29) with respect to the perturbations of the film height and the solvent fraction. This linearization will be useful for the analysis of the steady state to which the film height and solvent fraction tend. The result of the steady state analysis will be a "spin coating kernel function" that can be used to calculate the film height modulations that result after spin coating over topographies.

The substrate topography is written in the form $$B(x,y) = \alpha \cdot \phi(x,y), \tag{31}$$

where $\alpha$ denotes the perturbation parameter. Generally, the perturbation parameter $\alpha$ is in the range between 0 and 1. The modeled resist film height H, the solvent fraction $\langle x_s\rangle$ and the pressure can be expanded as $$H(x,y,t) = H_0(t) + \alpha \cdot h_1(x,y,t) + O(\alpha^2),$$

$$\langle x_s\rangle(x,y,t) = x_0(t) + \alpha \cdot x_1(x,y,t) + O(\alpha^2),$$

$$p(x,y) = P_0 + \alpha \cdot P_1(x,y) + O(\alpha^2),$$

where $O(\alpha^2)$ denotes terms of order $\alpha^2$ and the unperturbed ($\alpha=0$) film height $H_0$ and solvent fraction $x_0$ have been assumed to be position independent. The coordinate independence of the unperturbed pressure $P_0$ then follows as a consequence.

Now the expansions in terms of the perturbation parameter are inserted in the equations (28) and (29), which yields equations for the different perturbational orders. Here, only the first two orders are considered to describe the evolution of the modeled resist film height H and the solvent fraction $\langle x_s\rangle$, which is a valid approximation for a sufficiently small perturbation parameter.

For the unperturbed film height and solvent fraction, the following result is determined:

$$\frac{dH_0}{dt} = \frac{-1}{\mu(x_0)}\left(H_0^2 R + \frac{2}{3}H_0^3\omega^2\rho\right) - a\omega^{1/2}(x_0 - x_s^{res}) \tag{32}$$

and $$\frac{dx_0}{dt} = \frac{-a\omega^{1/2}}{H_0}(1 - x_0)(x_0 - x_s^{res}).$$

In order to obtain the equations corresponding to order $O(\alpha)$ the following Taylor expansions in terms of $\alpha$ are determined:

$$\frac{(1 - \langle x_s\rangle)(\langle x_s\rangle - x_s^{res})}{H - B} = \frac{1}{H_0}(1 - x_0)(x_0 - x_s^{res}) +$$

$$\frac{\alpha}{H_0}\left\{x_1(1 - 2x_0 + x_s^{res}) - \frac{h_1 - \phi}{H_0}(1 - x_0)(x_0 - x_s^{res})\right\} +$$

$$O(\alpha^2)\frac{1}{\mu(\langle x_s\rangle)}f(\langle x_s\rangle) =$$

-continued $$\frac{1}{\mu(x_0)} f(x_0) + \alpha \left\{ \frac{1}{\mu(x_0)} \frac{\partial f}{\partial \alpha} \bigg|_{\alpha=0} - \frac{x_1}{\mu(x_0)^2} \frac{\partial \mu}{\partial x_0} \right\} + O(\alpha^2),$$

$$\frac{\partial \gamma}{\partial q} = \alpha \frac{\partial \gamma}{\partial x_0} \frac{\partial x_1}{\partial q} + O(\alpha^2),$$

$$\frac{\partial \mu}{\partial q} = \alpha \frac{\partial \mu}{\partial x_0} \frac{\partial x_1}{\partial q} + O(\alpha^2),$$

with $$q = x, y.$$

Inserting the perturbation expansions in terms of $\alpha$ for the modeled resist film height H and the solvent fraction $\langle x_s \rangle$ into equations (28) and (29) and equating all terms of order $O(\alpha)$ yields for the first order perturbations $h_1$ and $x_1$ of the film height $$\frac{\partial h_1}{\partial t} = \frac{H_0^2}{2\mu^2} \frac{\partial \mu}{\partial x_0} \left\{ R_1 \left( x \frac{\partial x_1}{\partial x} + y \frac{\partial x_1}{\partial y} \right) + 2R_1 x_1 - T \left( y \frac{\partial x_1}{\partial x} - x \frac{\partial x_1}{\partial y} \right) \right\} - \quad (33)$$

$$\frac{H_0}{\mu} \left\{ R_2 \left( x \frac{\partial (h_1 - \phi)}{\partial x} + y \frac{\partial (h_1 - \phi)}{\partial y} \right) + \right.$$

$$2R_2 (h_1 - \phi) - T \left( y \frac{\partial (h_1 - \phi)}{\partial x} - x \frac{\partial (h_1 - \phi)}{\partial y} \right) +$$

$$\left. \frac{H_0}{2} \frac{\partial \gamma}{\partial x_0} \left( \frac{\partial^2 x_1}{\partial x^2} + \frac{\partial^2 x_1}{\partial y^2} \right) - \frac{H_0^2}{3} \left( \frac{\partial^2 P_1}{\partial x^2} + \frac{\partial^2 P_1}{\partial y^2} \right) \right\} - a\omega^{1/2} x_1$$

and the solvent fraction $$\frac{\partial x_1}{\partial t} = -\frac{H_0}{2\mu} \left\{ R_1 \left( x \frac{\partial x_1}{\partial x} + y \frac{\partial x_1}{\partial y} \right) - T \left( y \frac{\partial x_1}{\partial x} - x \frac{\partial x_1}{\partial y} \right) \right\} + \quad (34)$$

$$\frac{a\omega^{1/2}}{H_0} \left( \frac{h_1 - \phi}{H_0} (1 - x_0)(x_0 - x_s^{res}) - x_1 (1 - 2x_0 + x_s^{res}) \right)$$

where the abbreviations $$R_1 = \left( R + \frac{2}{3} H_0 \omega^2 \rho \right) \text{ and } R_2 = (R + H_0 \omega^2 \rho)$$

have been introduced.

Next, the expression for the pressure perturbation $P_1(x,y)$ needs to be determined. To evaluate the pressure perturbation $P_1(x,y)$, the balance for the normal stress tensor components at the resist-air interface are employed. The normal stress tensor boundary condition correct up to $O(\alpha)$ reads:

$$p = p_{ext} + 2\mu \frac{\partial w}{\partial z} - \gamma \left( \frac{\partial^2 H}{\partial x^2} + \frac{\partial^2 H}{\partial y^2} \right) \quad (35)$$

at $$z = H,$$

where $p_{ext}$ stands for the external pressure. On account of the continuity equation, using equation (26) for evaluating up to first order terms and inserting the result in (35) yields finally for the pressure perturbation $P_1(x,y)$:

$$P_1 = -\gamma \left( \frac{\partial^2 h_1}{\partial x^2} + \frac{\partial^2 h_1}{\partial y^2} \right) - 4(R + H_0 \omega^2 \rho)(h_1 - \phi) - \quad (36)$$

$$2H_0 \omega^2 \rho \left( x \frac{\partial (h_1 - \phi)}{\partial x} + y \frac{\partial (h_1 - \phi)}{\partial y} \right) - 2H_0 \frac{\partial \gamma}{\partial x_0} \left( \frac{\partial^2 x_1}{\partial x^2} + \frac{\partial^2 x_1}{\partial y^2} \right) +$$

$$2 \frac{H_0}{\mu} \frac{\partial \mu}{\partial x_0} \left( R + \frac{H_0}{2} \omega^2 \rho \right) \left( x \frac{\partial x_1}{\partial x} + y \frac{\partial x_1}{\partial y} \right) +$$

$$2R \left( x \frac{\partial \phi}{\partial x} + y \frac{\partial \phi}{\partial y} \right) + H_0^2 \left( \frac{\partial^2 P_1}{\partial x^2} + \frac{\partial^2 P_1}{\partial y^2} \right)$$

This is a partial differential equation for the pressure perturbation $P_1(x,y)$. In order to solve equations (32 to 34) and (36) appropriate initial and boundary conditions are necessary.

In the following the governing equations (33), (34) and (36) for the perturbations of the film height $h_1$, the solvent fraction $x_1$ and the pressure $P_1$ will be restricted to a small area. For the lubrication approximation still to hold, the areas must be much larger in extension than the resist thickness. On the other hand, the areas are to be so small that the differential operators in the governing equations can be replaced by a center position of the respective small area under consideration.

This replacement can be justified by introducing the scaled and dimensionless coordinates $\xi$ and $\eta$:

$$x = r_{max} \cdot \xi, \, y = r_{max} \cdot \eta, \, r_{max} = \sqrt{|x|_{max}^2 + |y|_{max}^2}, \quad (37)$$

wherein $r_{max}$, $|x|_{max}^2$ and $|y|_{max}^2$ denote the maximum radial coordinate and the maximum absolute values of the lateral x and y coordinates, respectively, inside the small area under consideration.

The so-defined dimensionless scaled coordinates $\xi$ and $\eta$ are both restricted to the values in the range between −1 and 1. Inside the small area, the x and y coordinates can be expressed by the center coordinates $\bar{x}$ and $\bar{y}$ plus a displacement $\delta x$ and $\delta y$, respectively, as $$x = \bar{x} + \delta x \text{ and } y = \bar{y} + \delta y, \text{ where } |\delta x| < \Delta x \text{ and } |\delta y| < \Delta y.$$

Also the center coordinates $\bar{x}$ and $\bar{y}$ and the displacements $\delta x$ and $\delta y$ can be expressed in scaled coordinates as $$\bar{x} = r_{max} \bar{\xi}, \, \bar{y} = r_{max} \bar{\eta}, \, \delta x = r_{max} \delta \xi, \text{ and } \delta y = r_{max} \delta \eta.$$

In terms of these scaled coordinates the differential operators in equation (33, 34) and (36) become $$x \frac{\partial}{\partial x} + y \frac{\partial}{\partial y} = \underbrace{\bar{\xi} \frac{\partial}{\partial \xi} + \bar{\eta} \frac{\partial}{\partial \eta}}_{\bar{x} \frac{\partial}{\partial x} + \bar{y} \frac{\partial}{\partial y}} + \delta \xi \frac{\partial}{\partial \xi} + \delta \eta \frac{\partial}{\partial \eta}$$

and $$y \frac{\partial}{\partial x} - x \frac{\partial}{\partial y} = \underbrace{\bar{\eta} \frac{\partial}{\partial \xi} - \bar{\xi} \frac{\partial}{\partial \eta}}_{\bar{y} \frac{\partial}{\partial x} - \bar{x} \frac{\partial}{\partial y}} + \delta \xi \frac{\partial}{\partial \xi} - \delta \xi \frac{\partial}{\partial \eta}.$$

If the small area under consideration is located far enough from the wafer center, the scaled displacements both are very small compared to unity $$|\delta \xi| \ll 1 \text{ and } |\delta \eta| \ll 1.$$

Under this condition the replacement $$x\frac{\partial}{\partial x} + y\frac{\partial}{\partial y} \approx \bar{x}\frac{\partial}{\partial x} + \bar{y}\frac{\partial}{\partial y} \qquad (38)$$

and $$y\frac{\partial}{\partial x} - x\frac{\partial}{\partial y} \approx \bar{y}\frac{\partial}{\partial x} - \bar{x}\frac{\partial}{\partial y}$$

is a valid approximation.

A typical size of the small areas is approximately 0.05 cm. Thus, for small areas of this size whose center coordinates are located farther than, say 1 cm, from the wafer 15 center the replacements (38) can be expected to be a good approximation.

These preliminaries allow a Fourier expansion of the governing equations inside the small areas. The lateral coordinates inside the small areas are given by the center coordinates $\bar{x}$ and $\bar{y}$ and small displacements $\delta x$ and $\delta y$.

The following Fourier expansions are used:

$$\phi\begin{pmatrix} \bar{x}+ \\ \delta x, \bar{y}+ \\ \delta y \end{pmatrix} = \int\int_{-\infty}^{\infty} d v_x d v_y f(v_x, v_y) \exp\left(2\pi i\begin{pmatrix} v_x[\bar{x}+\delta x]+ \\ v_y[\bar{y}+\delta y] \end{pmatrix}\right)$$

$$h_1\begin{pmatrix} \bar{x}+ \\ \delta x, \bar{y}+ \\ \delta y, t \end{pmatrix} = \int\int_{-\infty}^{\infty} d v_x d v_y \tilde{h}_1(v_x, v_y, t) \exp\left(2\pi i\begin{pmatrix} v_x[\bar{x}+\delta x]+ \\ v_y[\bar{y}+\delta y] \end{pmatrix}\right),$$

$$x_1\begin{pmatrix} \bar{x}+ \\ \delta x, \bar{y}+ \\ \delta y, t \end{pmatrix} = \int\int_{-\infty}^{\infty} d v_x d v_y \tilde{x}_1(v_x, v_y, t) \exp\left(2\pi i\begin{pmatrix} v_x[\bar{x}+\delta x]+ \\ v_y[\bar{y}+\delta y] \end{pmatrix}\right),$$

$$P_1\begin{pmatrix} \bar{x}+ \\ \delta x, \bar{y}+ \\ \delta y \end{pmatrix} = \int\int_{-\infty}^{\infty} d v_x d v_y \tilde{p}_1(v_x, v_y) \exp\left(2\pi i\begin{pmatrix} v_x[\bar{x}+\delta x]+ \\ v_y[\bar{y}+\delta y] \end{pmatrix}\right)$$

where $v_x$ and $v_y$ are spatial frequencies.

For the small area under consideration only the fixed values $\bar{x}$ and $\bar{y}$ enter the equations (33, 34) and (36). Therefore, the Fourier expansions lead to a set of ordinary differential equations for the Fourier coefficients. In terms of the Fourier coefficients the equation for the pressure perturbation becomes $$\tilde{p}_1(v_x, v_y) = \frac{\tilde{x}_1 \cdot A + \tilde{h}_1 \cdot B + f \cdot C}{1 + (2\pi)^2 H_0^2(v_x^2 + v_y^2)}, \qquad (39)$$

with the following abbreviations:

$$A(v_x, v_y, \bar{x}, \bar{y}) =$$
$$H_0\left\{\frac{2\pi i}{\mu}\frac{\partial\mu}{\partial x_0}2R_3(v_x\bar{x}+v_y\bar{y}) + (2\pi)^2\frac{\partial\gamma}{\partial x_0}2(v_x^2+v_y^2)\right\},$$

$$B(v_x, v_y, \bar{x}, \bar{y}) = \gamma(2\pi)^2(v_x^2, v_y^2) - 4R_2 - 2\pi i \cdot 2H_0\omega^2\rho(v_x\bar{x}+v_y\bar{y}),$$

$$C(v_x, v_y, \bar{x}, \bar{y}) = 4R_2 + 2\pi i \cdot 2R_2(v_x\bar{x}+v_y\bar{y})$$

and

-continued $$R_3 = \left(R + \frac{1}{2}H_0\omega^2\rho\right).$$

For each pair of spatial frequencies $v_x$ and $v_y$, the equations for the Fourier coefficients of the perturbations of the film height and the solvent fraction can be cast into matrix form:

$$\frac{d}{dt}\begin{pmatrix} \tilde{h}_1(v_x, v_y, t) \\ \tilde{x}_1(v_x, v_y, t) \end{pmatrix} = \begin{pmatrix} D & E \\ F & G \end{pmatrix}\begin{pmatrix} \tilde{h}_1 \\ \tilde{x}1 \end{pmatrix} - f(v_x, v_y)\begin{pmatrix} H \\ F \end{pmatrix} \qquad (40)$$

where the coefficients are given by:

$$D(v_x, v_y, \bar{x}, \bar{y}) = \frac{-H_0}{\mu}\{R_2(2+2\pi i(v_x\bar{x}+v_y\bar{y})) - 2\pi i \cdot T \cdot (v_x\bar{y}-v_y\bar{x})\} -$$
$$\frac{H_0}{3\mu}\frac{H_0^2(2\pi)^2(v_x^2+v_y^2)}{1+H_0^2(2\pi)^2(v_x^2+v_y^2)}B(v_x, v_y\bar{x}, \bar{y})$$

$$E(v_x, v_y, \bar{x}, \bar{y}) = -a\omega^{1/2} +$$
$$\frac{H_0^2}{2\mu^2}\frac{\partial\mu}{\partial x_0}\{R_1(2+2\pi i(v_x\bar{x}+v_y\bar{y})) - 2\pi i \cdot T \cdot (v_x\bar{y}-v_y\bar{x})\} +$$
$$\frac{H_0^2}{2\mu}\frac{\partial\gamma}{\partial x_0}(2\pi)^2(v_x^2+v_y^2) - \frac{H_0}{3\mu}\frac{H_0^2(2\pi)^2(v_x^2+v_y^2)}{1+H_0^2(2\pi)^2(v_x^2+v_y^2)}A(v_x, v_y, \bar{x}, \bar{y})$$

$$F = \frac{a\omega^{1/2}}{H_0^2}(1-x_0)(x_0-x_s^{res})$$

$$G(v_x, v_y, \bar{x}, \bar{y}) =$$
$$\frac{-2\pi i H_0}{2\mu}\{R_1 \cdot (v_x\bar{x}+v_y\bar{y}) - T \cdot (v_x\bar{y}-v_y\bar{x})\} - \frac{a\omega^{1/2}}{H_0}(1-2x_0+x_s^{res})$$

$$H(v_x, v_y, \bar{x}, \bar{y}) = \frac{-H_0}{\mu}\{R_2(2+2\pi i(v_x\bar{x}+v_y\bar{y})) - 2\pi i \cdot T \cdot (v_x\bar{y}-v_y\bar{x})\} +$$
$$\frac{H_0}{3\mu}\frac{H_0^2(2\pi)^2(v_x^2+v_y^2)}{1+H_0^2(v_x^2+v_y^2)}C(v_x, v_y, \bar{x}, \bar{y})$$

The coefficients A, B and C are given below the expression (39) for the Fourier coefficients of the pressure perturbation.

The ordinary differential equations (40) for the Fourier coefficients can be solved numerically together with the equations (32) for the unperturbed film height and unperturbed solvent fraction. However, a quantitative modeling of the time evolution requires not only initial conditions to be known but also the functional dependence of the surface tension coefficient and the viscosity on the solvent fraction.

Now, a solution for the steady state is constructed. Experimentally it is known that the film height and solvent fraction approach finally a state that is practically independent of a further prolongation of the spin coating time. This steady state is approached if the spin coating period lasts long enough. Then, the final film thickness and the final solvent fraction will be reached.

In the steady state, equations (40) simplify to $$\begin{pmatrix} D & E \\ F & G \end{pmatrix}\begin{pmatrix} \tilde{h}_1 \\ \tilde{x}_1 \end{pmatrix} = f(v_x, v_y)\begin{pmatrix} H \\ F \end{pmatrix}, \qquad (41)$$

whose solution reads $$\begin{pmatrix} \tilde{h}_1 \\ \tilde{x}_1 \end{pmatrix} = \frac{f(v_x, v_y)}{D \cdot G - E \cdot F} \begin{pmatrix} H \cdot G - E \cdot F \\ -F \cdot H + D \cdot F \end{pmatrix}. \quad (42)$$

Additionally, equation (32) for the unperturbed solvent fraction $x_0$ gives in the steady state $$\frac{dx_0}{dt} \doteq 0 = \frac{-a\omega^{1/2}}{H_0}(1 - x_0)(x_0 - x_s^{res}), \quad (43)$$

which shows that the coefficient F approaches zero in the steady state.

Then, it follows also that the Fourier coefficients of the perturbation of the solvent fraction vanish. Thus, the steady state is characterized by a uniform solvent distribution.

In contrast to the uniform solvent distribution the result for the Fourier coefficients of the film height modulation becomes in the steady state $$\tilde{h}_1(v_x, v_y) = \underbrace{\frac{H(v_x, v_y)}{D(v_x, v_y)}}_{\tilde{S}(v_x, v_y)} f(v_x, v_y) \quad (44)$$

$\tilde{S}(v_x, v_y)$ describes the frequency response of the film height modulation. Using the explicit expressions for H and D results in $$\tilde{S}(v_x, v_y) = \quad (45)$$

$$\frac{6R_2 + 2R_2Q(v_x^2 + v_y^2) + i[av_x + bv_y + Q(v_x^2 + v_y^2)(cv_x + dv_y)]}{\Gamma(v_x^2 + v_y^2)^2 + 6R_2 + 2R_2Q(v_x^2 + v_y^2) + i[av_x + bv_y + Q(v_x^2 + v_y^2)(ev_x + gv_y)]}$$

where the following abbreviations have been used $\Gamma = \gamma(2\pi)^4 H_0^2$, $Q = H_0^2(2\pi)^2$, $a(\bar{x}, \bar{y}) = 6\pi(R_2 \bar{x} - T\bar{y})$, $b(\bar{x}, \bar{y}) = 6\pi(R_2 \bar{y} + T\bar{x})$, $c(\bar{x}, \bar{y}) = 2\pi(R_2 \bar{x} - 3T\bar{y})$, $d(\bar{x}, \bar{y}) = 2\pi(R_2 \bar{y} + 3T\bar{x})$, $e(\bar{x}, \bar{y}) = 2\pi((3R_2 - 2H_0\omega^2\rho)\bar{x} - 3T\bar{y})$, $g(\bar{x}, \bar{y}) = 2\pi((3R_2 - 2H_0\omega^2\rho)\bar{y} + 3T\bar{x})$, and $R_2 = R + H_0\omega^2\rho$.

Interestingly, the only material parameters of the resist 10 that enter the expression for the frequency response are the resist density and the surface tension coefficient for the finally approached solvent content. In particular, the steady state frequency response is independent of the final viscosity. In the steady state, the equation for the film height modulation decouples completely from the solvent content and from the gradients of surface tension and viscosity. Only the time evolution is concerned by these quantities.

The relation given by the frequency response between the Fourier components of the film height modulations and the Fourier components of the topographical perturbation corresponds to a convolution in the position space $$H(\bar{x} + \delta x, \bar{y} + \delta y) = \quad (46)$$

$$H_0 + \underbrace{\iint_{-\infty}^{\infty} d\xi d\eta B(\bar{x} + \delta x - \xi, \bar{y} + \delta y - \eta) \cdot S(\xi, \eta, \bar{x}, \bar{y})}_{\alpha h_{1(\bar{x} + \delta x, \bar{y} + \delta y)}},$$

where $H(\bar{x}+\delta x, \bar{y}+\delta y)$ denotes the film height at a position with coordinates $\delta x$ and $\delta y$ relative to the center coordinates $\bar{x}$ and $\bar{y}$ of the small area under consideration.

The film height is given by the unperturbed film height in the steady state plus the convolution of the local topography with the local "spin coating kernel function" that depends parametrically on the center coordinates. The perturbational order parameter $\alpha$ does not appear in the final expression for the film height anymore.

The spin coating kernel is given as the inverse Fourier transform of the frequency response $$S(\delta x, \delta y, \bar{x}, \bar{y}) = \quad (47)$$

$$\iint_{-\infty}^{\infty} dv_x dv_y \tilde{S}(v_x, v_y, \bar{x}, \bar{y}) \exp(2\pi i(v_x \delta x + v_y \delta y)).$$

The spin coating kernel is normalized according to $$\iint_{-\infty}^{\infty} d\delta x d\delta y S(\delta x, \delta y, \bar{x}, \bar{y}) = \tilde{S}(0, 0) = 1. \quad (48)$$

Accordingly, the spin coating kernel function has the meaning of a "point spread function" describing the resulting film height modulation that is induced by a topographical point defect at $\bar{x}$ and $\bar{y}$.

By numerically (inverse) Fourier transforming the frequency response according to equation (45), the lateral extent of the spin coating kernel can be determined. Assuming a typical side length of the small area under consideration of, say 0.05 cm, this then allows checking the consistency of the small area approximation for the steady state.

For each center position, the spin coating kernel function is characterized by six parameters only. The first two are operating parameters of the spin coating process, i.e., spin speed and unperturbed film height. Secondly, depends on two material properties of the resist 10, which are given by the mass density and the finally approached surface tension coefficient of the resist 10.

Also, the spin coating kernel depends on the density and the viscosity of the air 14 above the wafer. Except for the final surface tension coefficient $\gamma$ these parameters are well known. The final surface tension coefficient $\gamma$ has to be determined experimentally, either by direct measurement or by fitting the predicted film height modulations to experimental data. A typical value for surface tension coefficient $\gamma$ for photo resists is 30 dyn/cm, with 1 dyn=$10^{-5}$ N.

The following example calculations use the values $\gamma$=30 dyn/cm for the final surface tension coefficient and $\rho$=1.017 g/cm$^3$ for the resist density. The viscosity $\mu_{air}$=1.81 10$^{-4}$ g/(sec×cm) and the density of air $\rho_{air}$=1.25×10$^{-3}$ g/cm$^3$ are used. The final unperturbed resist thickness has been chosen to be 440 nm and the spin speed is 1300 rpm.

A typical figure of the modulus of the frequency response corresponding to the above parameters is shown in FIG. 2. The modulus of the frequency response as given in equation (45) is plotted for the center position $\bar{x}$=−5 cm and $\bar{y}$=5 cm.

The modulus of the frequency response $\tilde{S}(v_x, v_y)$ is shown at including the effect of air shear above the wafer as obtained from equation (45).

Figure 3:
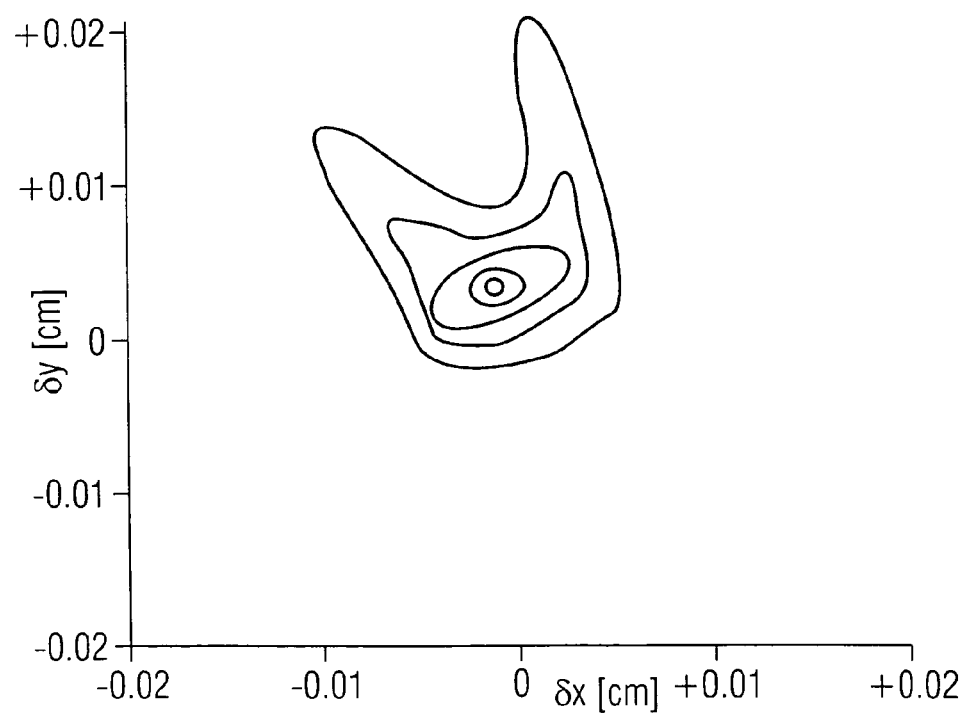
FIG. 3 illustrates a result of the spin coating model according to an embodiment of the invention.

The corresponding convolution kernel S($\delta$x, $\delta$y, $\bar{x}$, $\bar{y}$) can be obtained by numerically Fourier transforming equation (45). FIG. 3 shows the "spin coating convolution kernel" corresponding to FIG. 2.

The lateral extent of the convolution kernel describes its range of influence. For the given example kernel with center coordinates located at $\bar{x}$=−5 cm and $\bar{y}$=5 cm, this range can be estimated to be in the range between 0.005 to 0.01 cm.

Topographical substrate structures that are farther distant than this range do not significantly influence the film height modulations at the center position.

FIG. 2 and FIG. 3 show that the air shear tilts both, the frequency response as well as the spin coating kernel and the direction of narrowest extent is tilted. This effect is due to the tangentially acting air drag. Furthermore the extension of the spin coating kernel function is reduced. The existence of the tilt and the spatial concentration of the spin coating kernel function due to the air shear above the wafer 15 is a general feature that holds at all wafer positions.

The spatial concentration of the spin coating kernel function is an undesired feature, since small spin coating kernels correspond to more pronounced film height modulations. A blurred spin coating kernel function will be mostly preferred since blurring of the spin coating kernel function corresponds to an averaging of the film height modulations.

Referring now to FIG. 4, a first topography 26 is considered as an example. FIG. 4 shows a top view onto the example topography 26 on substrate 15 with square blocks 28 of area 30 μm×30 μm and a height of 100 nm in z-direction. The resulting film height modulations after spin coating over this topography 26 are predicted for different wafer positions $\bar{x}$, $\bar{y}$ and different spin speeds.

To visualize the position dependency of the film height modulations, three wafer positions are considered along a radius arm. The three wafer positions are i) $\bar{x}$=1 cm and $\bar{y}$=1 cm, ii) $\bar{x}$=5 cm and $\bar{y}$=5 cm, and iii) $\bar{x}$=10 cm and $\bar{y}$=10 cm.

Figure 5A:
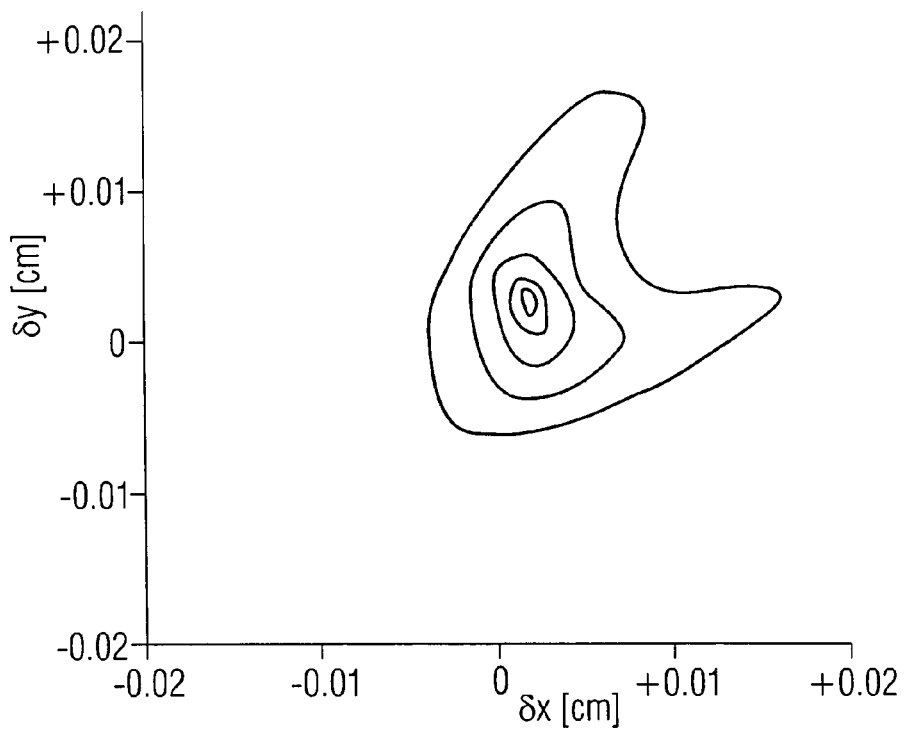
FIGS. 5A to 5C illustrate a result of the spin coating model according to an embodiment of the invention.

Close to the wafer center ($\bar{x}$=1 cm and $\bar{y}$=1 cm), see FIG. 5A, the spin coating kernel has a relatively wide spatial extension.

Figure 5B:
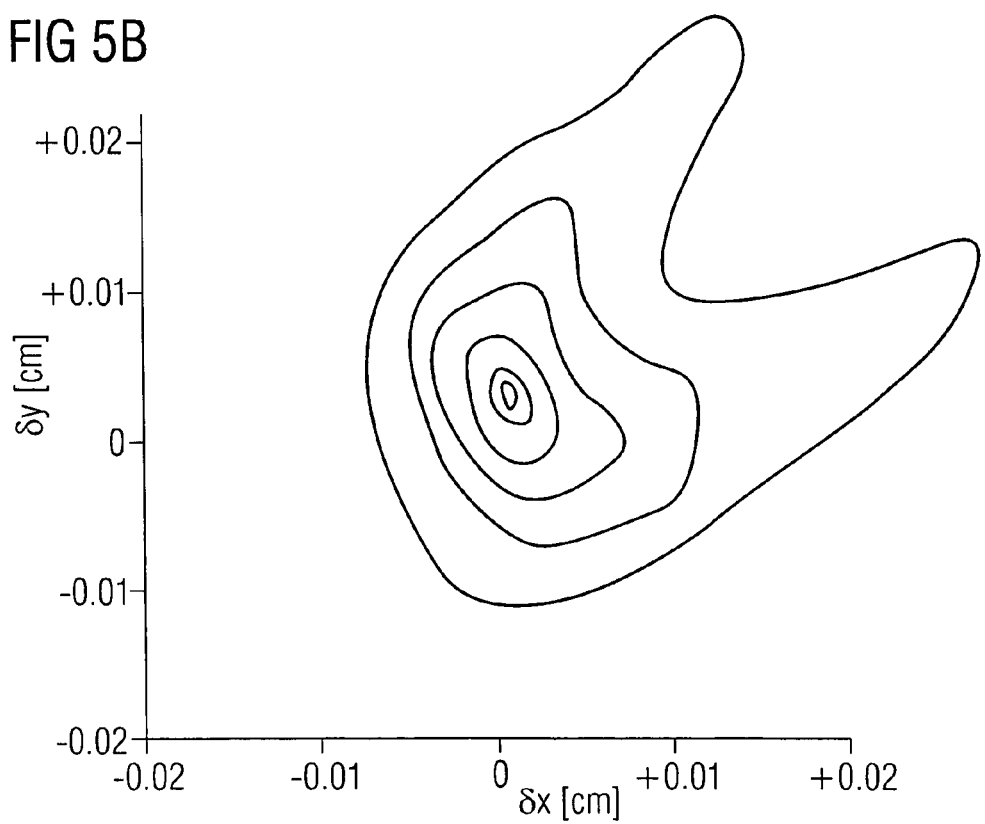

At $\bar{x}$=5 cm and $\bar{y}$=5 cm, the spin coating kernel becomes narrower, see FIG. 5B.

Figure 5C:
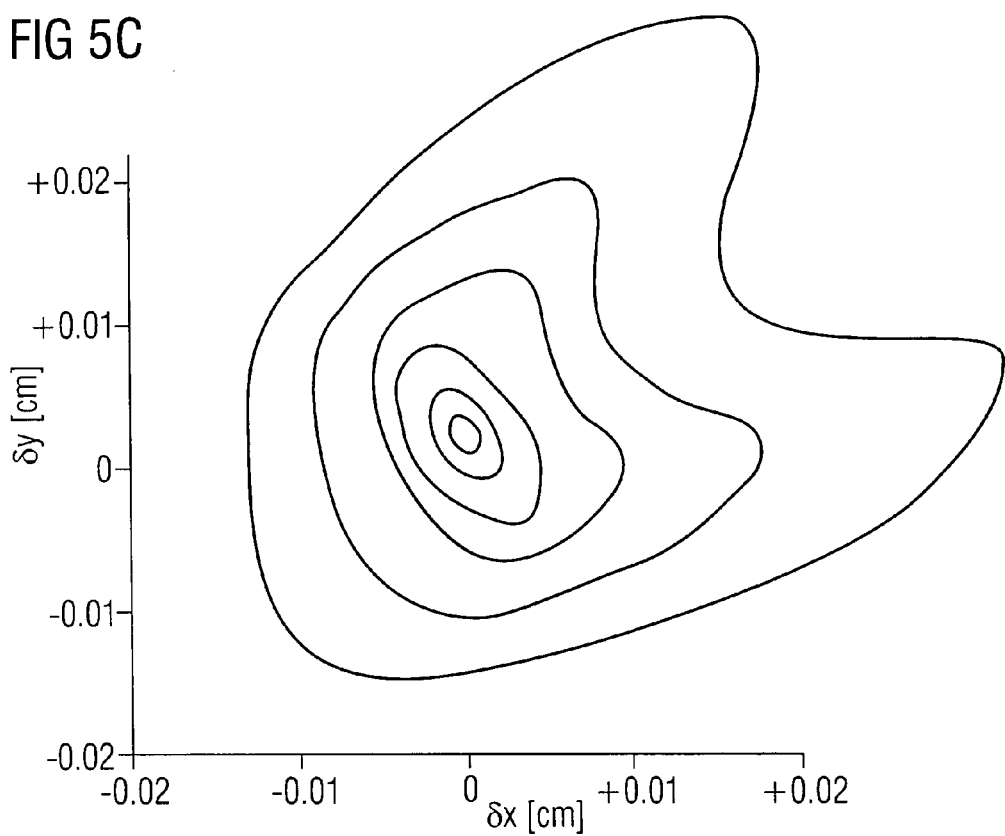

Close to the wafer edge along the radius arm the spin coating kernel has its narrowest shape, see FIG. 5C.

By comparison of FIGS. 5A to 5C, it can be seen that the air shear induced tapering of the spin coating kernel along the radius arm corresponds to more and more pronounced film height modulations.

In another embodiment of the invention, the initial solvent content of the photo resist 10 is varied. If the initial solvent content is increased this corresponds to a reduced initial viscosity. Although the actual resist chemistry is rather complex, a simple model for the impact of a reduced initial viscosity at constant (unperturbed) film height $H_0$ would predict that the final (steady state) viscosity remained the same for the steady state, no matter which initial viscosity had been prepared.

Also, if the initial viscosity is to be changed the spin speed has to be adjusted in order to obtain the same final (unperturbed) resist height. Reducing the initial viscosity thus necessitates a reduction of the spin speed.

Therefore, the effect of reducing the initial viscosity corresponds to setting the spin speed in formula (45) to a smaller value.

Figure 6:
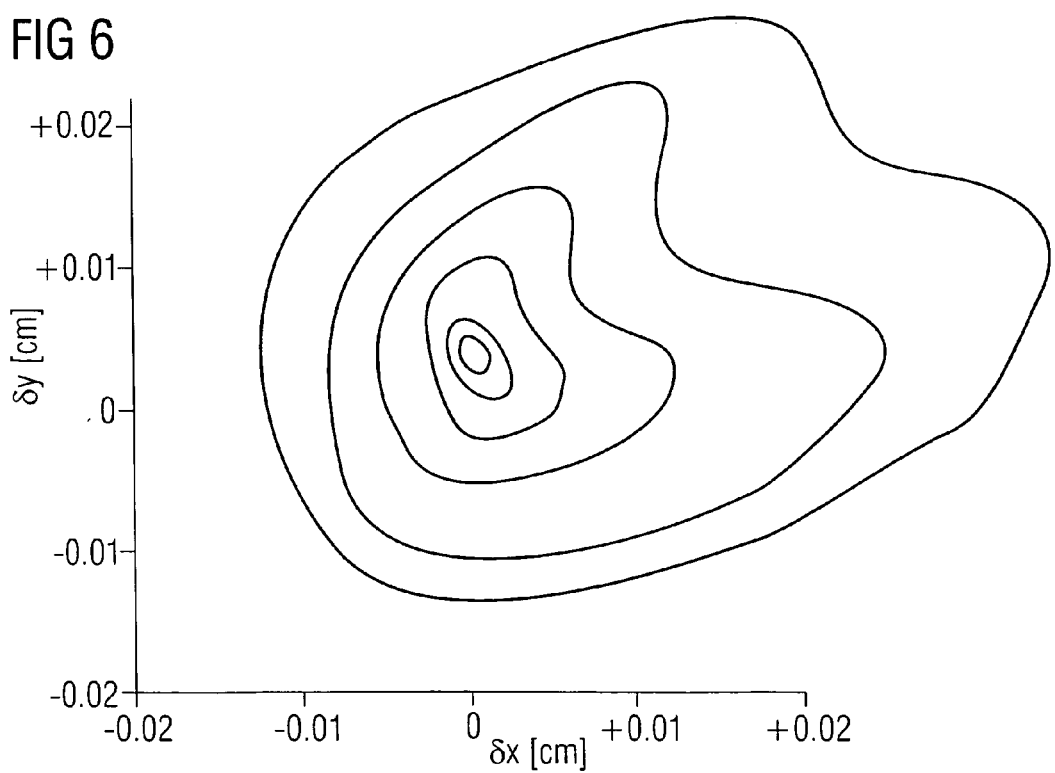
FIG. 6 illustrates a result of the spin coating model according to an embodiment of the invention.

In order to demonstrate the effect, the spin speed is set to 800 rpm. The resulting spin coating kernel close to the wafer center ($\bar{x}$=1 cm and $\bar{y}$=1 cm) is shown in FIG. 6. Accordingly, the spin coating kernel has a relatively smaller spatial extension as compared to FIG. 4.

As a result, a reduced initial viscosity corresponds to a blurred spin coating kernel and thus to less pronounced film height modulations. Thus, film height modulations can be minimized by reducing the initial resist viscosity. However, an arbitrary dilution of the resist 10 cannot be achieved. The spin coating process requires a minimum resist viscosity for obtaining acceptable coating homogenities.

Application of the spin coating kernel of the spin coating model based on equations (45) and (46) revealed some basic trends. First, film height modulations become more pronounced for increasing radial positions on the wafer. Second, reducing the initial viscosity (corresponding to a reduced spin speed) results in a flattening of the film height modulations.

The application of the spin coating kernel to particular topographical layer structures allows determining the film height modulations that result after spin coating of photo resist on such a layer. This possibility of application is of particular interest for "implant layers" where knowledge of the film height at specific sites inside the chip is a prerequisite to calculate the size of the implant structures that are lithographically to be formed.

Another determination of modeled resist film heights concerns the dependency of wafer signatures of film heights on the azimuthal wafer position. In particular topographical structures that show a strong asymmetrical orientation, e.g., an isolated line parallel to the coordinate axis, result in wafer signatures that show not only a radial but also a distinctively azimuthal position dependency over the wafer. This is a consequence of both, the dependency of the spatial extent of the spin coating kernel on the radial wafer coordinate and the deviation of its shape from radial symmetry around the center of the respective small wafer area.

Figure 7:
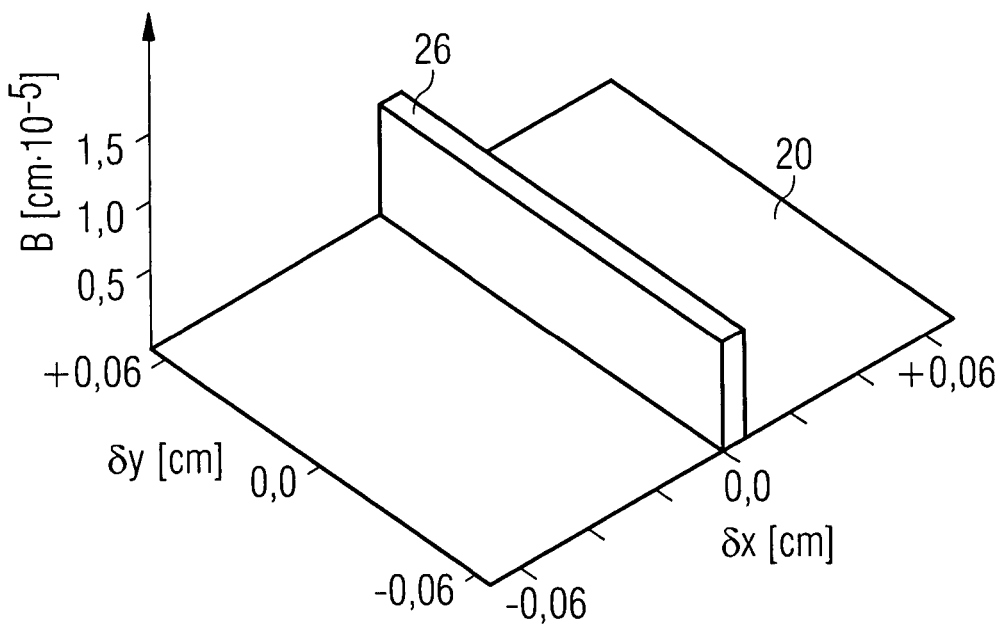
FIG. 7 illustrates further topography on a substrate according to an embodiment of the invention.

Referring now to FIG. 7, an isolated line structure (width=15 μm, height=100 nm) as an example for a topographical structure 26 is shown resulting in wafer signatures that are strongly dependent on the azimuthal wafer position.

Figure 8A:
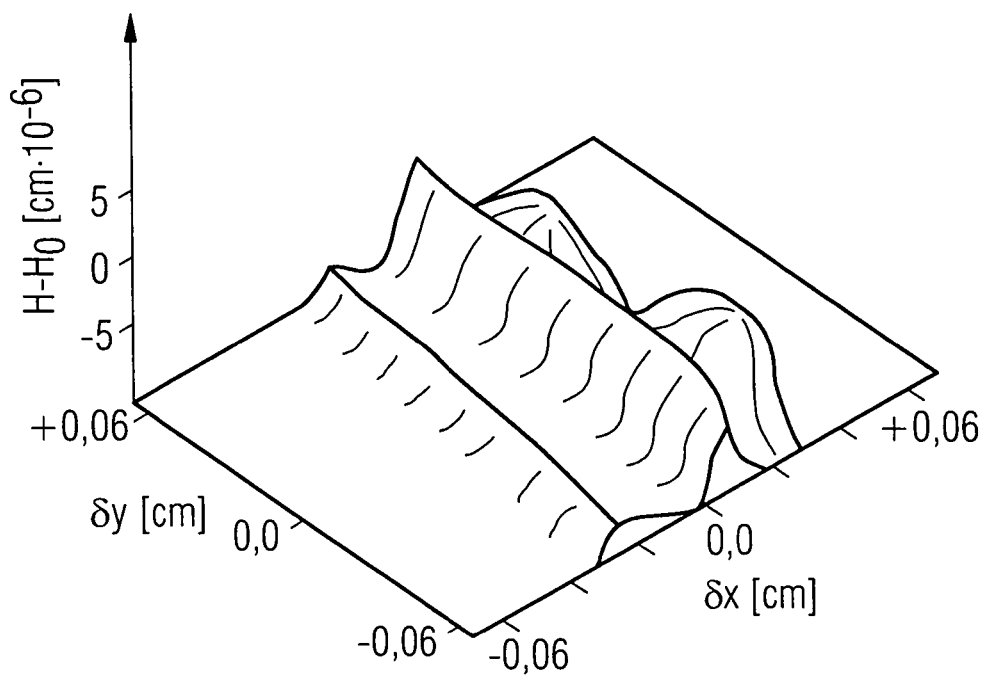
FIGS. 8A and 8B illustrate a result of the spin coating model according to an embodiment of the invention.
Figure 8B:
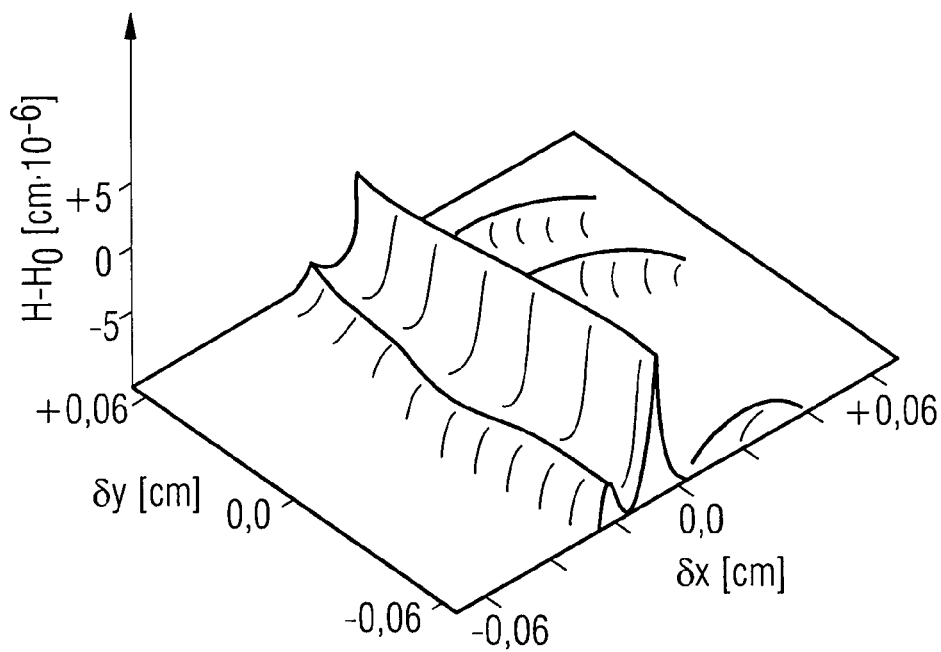

The resulting modeled resist film heights are shown in FIG. 8A and FIG. 8B for $\bar{x}$=0 cm and $\bar{y}$=8 cm and for $\bar{x}$=8 cm and $\bar{y}$=0 cm, respectively. The maximum resist film height modulation is in the first case 37 nm and in the second case 50 nm.

In order to minimize the undesired resist film modulations on topographical signatures, further structural elements can be included in the desired layout pattern.

Figure 9:
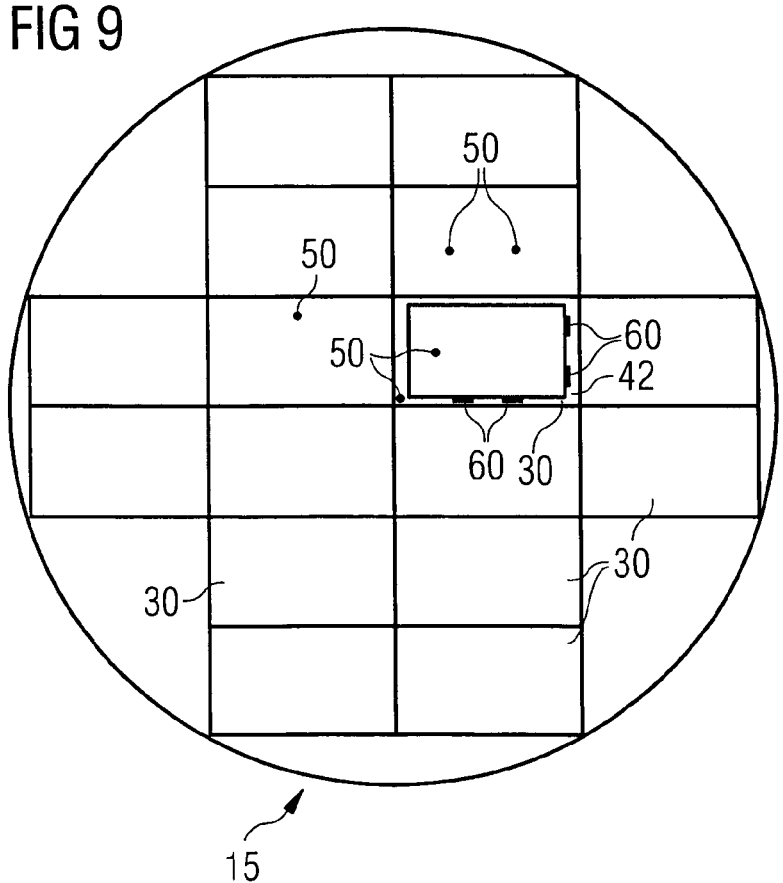
FIG. 9 depicts a top view on a substrate surface according to an embodiment of the invention.

Usually, the substrate topography is lithographically structured in plurality of juxtaposed image fields 30, as shown in FIG. 9. Each image field 30 has an active area 40 defining the electrical function of the produced circuit and a surrounding kerf area 42 which contains alignment and/or overlay marks and the like.

In a first step, several test points 50 are selected on the substrate. The test points 50 can be selected within the kerf area to define inter chip test points. The test points can also be selected within the active area to define intra chip test points.

Next, film height modulations are determined based on the difference of the unperturbed resist film height and the modeled resist film height for each of the test points 50.

The desired layout pattern is then optimized by implementing the further structural elements 60 in order to form an optimized mask pattern. This is performed by minimizing the film height modulations. The further structural elements 60 can be associated to the kerf area 42, as shown in FIG. 9 and/or to the active area 40.

Then, a lithographic mask can be provided in accordance with the optimized mask pattern. Consequently, the further structural elements are identical for each of image field 30.

It is, however, also conceivable to implement partially different further structural elements 60 for different image fields. This would require to either provide different lithographic masks or to provide an exchangeable sub-mask for the further structural elements 60.

By using the lithographic mask the substrate can be structures. This can be performed by a photolithographic projection or by using electron beam lithography.

Afterwards, a resist film 10 is spin coated onto the substrate 15, as explained above. The film height predictions that are made possible by the derived spin coating kernel function are a necessary prerequisite for such a "spin coating proximity correction".

Having described embodiments of the invention, it is noted that modifications and variations can be made by persons skilled in the art in light of the above teachings. It is therefore to be understood that changes may be made in the particular embodiments of the invention disclosed that are within the scope and spirit of the invention as defined by the appended claims.

Having thus described the invention with the details and the particularity required by the patent laws, what is claimed and desired to be protected by Letters Patent is set forth in the appended claims.

What is claimed is:

1. A method for compensating film height modulations in spin coating of a resist film layer, the method comprising:
   providing a desired layout pattern comprising a plurality of structural features, each structural feature having a characteristic feature size;
   determining a substrate topography as a result of lithographically structuring a substrate with said desired layout pattern in a plurality of image fields;
   providing a spin coating model, said spin coating model being applicable to determine a modeled resist film height based on said substrate topography during spin coating of a resist film;
   determining a nominal resist film height by using said spin coating model with an unperturbed substrate topography having a flat surface;
   selecting a plurality of test points on said substrate;
   determining film height modulations based on a difference of said nominal resist film height and said modeled resist film height for each of said test points; and
   optimizing said desired layout pattern by implementing further structural elements in order to form an optimized mask pattern by minimizing said film height modulations.

2. The method according to claim 1, further comprising:
   providing a lithographic mask in accordance with said optimized mask pattern;
   structuring said substrate using said lithographic mask; and
   spin coating a resist film onto said substrate.

3. The method according to claim 2, wherein prior to providing the spin coating model the following steps are performed:
   selecting a resist film being used during the spin coating step, said resist film having a resist density and a resist surface tension;
   selecting a spin speed being used during the spin coating step; and
   selecting an ambient density of an atmosphere surrounding said resist film layer during the spin coating step.

4. The method according to claim 1, wherein providing a spin coating model further comprises providing a spin coating model that includes a relationship between said modeled resist film height and said spin speed, said nominal resist film height, said resist density, said resist surface tension, said characteristic feature size, and said ambient density.

5. The method according to claim 4, wherein said spin coating model further comprises a relationship between a convolution of said topography and a spin coating kernel function.

6. The method according to claim 5, wherein said spin coating kernel function depends on the position on said substrate and is evaluated for each of said plurality of test points on said substrate.

7. The method according to claim 6, wherein said spin coating kernel function further depends on said spin speed, said nominal resist film height and said resist surface tension.

8. The method according to claim 4, wherein said atmosphere is air and said ambient density of said atmosphere is the density of air.

9. The method according to claim 8, wherein said spin coating kernel function further describes the effect of radially and tangentially acting shearing stresses that is due to the air flow above the substrate.

10. The method according to claim 3, wherein the step of selecting a resist film being used during the spin coating step is performed by using a solvent within said resist film.

11. The method according to claim 3, wherein said spin coating model determines said film height modulations and a content of said solvent in an area around said plurality of test points, said area being smaller than the surface of said substrate.

12. The method according to claim 11, wherein said modeled resist film height is determined as a function of the position on the substrate for each of said areas.

13. The method according to claim 1, wherein said modeled resist film height is determined by approaching a steady state, said steady state being described by a solvent content of said resist film being fully evaporated.

14. The method according to claim 13, wherein said steady state is described by a position dependent spin coating kernel function.

15. A method for compensating film height modulations in spin coating of a resist film layer, the method comprising:
   providing a desired layout pattern comprising a plurality of structural features each having characteristic feature sizes;
   determining a substrate topography as a result of lithographically structuring a substrate with said desired layout pattern in plurality of image fields;
   providing a spin coating model, said spin coating model being applicable to determine a modeled resist film height based on said substrate topography during a spin coating step of a resist film on said substrate as a function of respective positions on said substrate;
   determining a modeled resist film height for each of said respective positions on said substrate;

determining a nominal resist film height by using said spin coating model with an unperturbed substrate topography having a flat surface;

determining an average resist film height based on said nominal resist film height;

determining film height modulations based on a difference of said average resist film height and said modeled resist film height for each of said respective positions; and optimizing said desired layout pattern by implementing further structural elements in order to form an optimized mask pattern by minimizing said film height modulations.

16. The method according to claim 15, wherein said spin coating model determines said modeled resist film height for each of said respective positions as a perturbation being caused by said substrate topography in an area around said respective positions.

17. The method according to claim 15, wherein said spin coating model determines said modeled resist film height by inclusion of air shear.

18. The method according to claim 15, wherein said spin coating model determines said modeled resist film height by calculating a solvent content inside said area around said respective positions.

19. The method according to claim 15, wherein said spin coating model further comprises a relationship between a convolution of said topography and a spin coating kernel function.

20. The method according to claim 19, wherein said spin coating kernel function depends on the position on said substrate and is evaluated for each of said plurality of test points on said substrate.

21. The method according to claim 20, wherein said spin coating kernel function further depends on said spin speed, said nominal resist film height and said resist surface tension.

22. The method according to claim 21, wherein said atmosphere is air and said ambient density of said atmosphere is the density of air.

23. The method according to claim 22, wherein said spin coating kernel function further describes the effect of radially and tangentially acting shearing stresses that is due to the air flow above the substrate.

24. The method according to claim 23, wherein said spin coating kernel function further describes a finally approached steady state that allows predicting film height modulations after spin coating over topographies.

25. The method according to claim 15, wherein said spin coating model determines said modeled resist film height using partial differential equations for a time evolution of the resist film height and the local solvent mass fraction.

26. The method according to claim 15, wherein said solvent content is varied so as to minimize said modeled resist film height.

27. The method according to claim 25, wherein said spin coating model determines said modeled resist film height using partial differential equations, said equations being formulated in terms of a velocity field beneath the resist film surface.

28. The method according to claim 27, wherein said velocity field is derived on the basis of Navier-Stokes equations for an incompressible Newtonian resist liquid.

29. The method according to claim 28, wherein said velocity field further describes the influences of solvent evaporation, resist film curvature and surface tension gradients on the film height and the local solvent content as appropriate boundary conditions.

30. The method according to claim 29, wherein viscosity of said resist film and a surface tension coefficient of said resist film are described by an averaged solvent fraction.

31. A method for compensating film height modulations in spin coating of a resist film layer, the method comprising the steps of:

providing a desired layout pattern comprising a plurality of structural features each having characteristic feature sizes;

determining a substrate topography as a result of lithographically structuring a substrate with said desired layout pattern in plurality of image fields, said image fields having an active area and a surrounding kerf area;

providing a spin coating model, said spin coating model being applicable to determine a modeled resist film height based on said substrate topography during spin coating of a resist film;

determining a nominal resist film height by using said spin coating model with an unperturbed substrate topography having a flat surface;

selecting a plurality of test points on said substrate;

determining film height modulations based on a difference of said nominal resist film height and said modeled resist film height for each of said test points; and optimizing said desired layout pattern by implementing further structural elements in order to form an optimized mask pattern by minimizing said film height modulations.

32. The method according to claim 31, wherein said test points are selected within said kerf area.

33. The method according to claim 32, wherein said further structural elements are associated to said kerf area.

34. The method according to claim 31, wherein said test points are selected within said active area.

35. The method according to claim 34, wherein said further structural elements are associated to said active area.

36. The method according to claim 31, wherein said further structural elements are identical for each of said plurality of image fields.

37. The method according to claim 31, wherein said further structural elements are at least partially different for each of said plurality of image fields.

38. The method according to claim 31, further comprising:

providing a lithographic mask in accordance with said optimized mask pattern;

structuring said substrate using said lithographic mask; and spin coating a resist film onto said substrate.

39. The method according to claim 38, wherein said structuring said substrate using said lithographic mask is performed by photolithographic projection.

40. The method according to claim 38, wherein said structuring said substrate using said lithographic mask is performed by electron beam lithographie.

* * * * *